(12) United States Patent
Kondo et al.

(10) Patent No.: US 8,005,146 B2
(45) Date of Patent: Aug. 23, 2011

(54) VARIABLE LENGTH CODING METHOD AND VARIABLE LENGTH DECODING METHOD

(75) Inventors: Satoshi Kondo, Yawata (JP); Shinya Kadono, Nishinomiya (JP); Makoto Hagai, Moriguchi (JP); Kiyofumi Abe, Kadoma (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/710,673

(22) Filed: Feb. 23, 2010

(65) Prior Publication Data

US 2010/0150464 A1 Jun. 17, 2010

Related U.S. Application Data

(62) Division of application No. 10/481,277, filed as application No. PCT/JP03/04804 on Apr. 16, 2003.

(30) Foreign Application Priority Data

Apr. 26, 2002 (JP) ................................. 2002-126029
Dec. 13, 2002 (JP) ................................. 2002-363107

(51) Int. Cl.
 *H04N 11/02* (2006.01)
(52) U.S. Cl. .................. 375/240.23; 382/247
(58) Field of Classification Search .................. None
See application file for complete search history.

(56) References Cited

U.S. PATENT DOCUMENTS

| | | | |
|---|---|---|---|
| 5,510,785 A * | 4/1996 | Segawa et al. | ............... 341/67 |
| 5,751,232 A | 5/1998 | Inoue et al. | |
| 5,883,976 A | 3/1999 | Ohsawa | |
| 6,265,997 B1 * | 7/2001 | Nomizu | ............... 341/107 |
| 6,546,145 B1 * | 4/2003 | Miyake et al. | ............... 382/248 |
| 6,681,049 B1 | 1/2004 | Kobayashi et al. | |
| 6,829,300 B1 | 12/2004 | Ichioka | |
| 6,856,701 B2 * | 2/2005 | Karczewicz et al. | ......... 382/247 |
| 7,099,387 B2 * | 8/2006 | Bjontegaard et al. | ......... 375/240 |

(Continued)

FOREIGN PATENT DOCUMENTS

EP 0 267 578 5/1988

(Continued)

OTHER PUBLICATIONS

International Search Report issued Jul. 15, 2003 in corresponding International Application No. PCT/JP03/04804.

(Continued)

*Primary Examiner* — Marsha D Banks Harold
*Assistant Examiner* — Christopher Findley
(74) *Attorney, Agent, or Firm* — Wenderoth, Lind & Ponack, L.L.P.

(57) ABSTRACT

A variable length coding method is comprised of: a coefficient value scanning step in which an RL sequence generation unit 203, a reordering unit 202, and a binarization unit 203 scan coefficient values within a block in a predetermined scanning order starting at a higher-frequency component toward a lower-frequency component; and an arithmetic coding step in which an arithmetic coding unit 205 and a table storage unit 204 perform arithmetic coding on the absolute values of the coefficient values according to the scanning order used in the coefficient value scanning step, by switching between probability tables 1~4 for use, wherein, in the arithmetic coding step, a probability table to be used is switched to another probability table in one direction, when the arithmetic-coded absolute values of the coefficient values include an absolute value exceeding a predetermined threshold value.

6 Claims, 17 Drawing Sheets

U.S. PATENT DOCUMENTS

| | | | |
|---|---|---|---|
| 2001/0011959 A1* | 8/2001 | Hirano et al. | 341/65 |
| 2001/0024526 A1 | 9/2001 | Kadono | |
| 2001/0048769 A1 | 12/2001 | Kajiki et al. | |
| 2002/0126755 A1 | 9/2002 | Li et al. | |
| 2005/0254583 A1* | 11/2005 | Kim et al. | 375/240.23 |
| 2006/0171533 A1* | 8/2006 | Lee et al. | 380/28 |
| 2007/0160149 A1 | 7/2007 | Chujoh et al. | |

FOREIGN PATENT DOCUMENTS

| | | |
|---|---|---|
| EP | 0 616 471 A2 | 9/1994 |
| EP | 0 720 379 | 7/1996 |
| EP | 0 762 771 A2 | 3/1997 |
| EP | 0 873 017 | 10/1998 |
| EP | 1 150 434 | 10/2001 |
| JP | 4-100390 | 4/1992 |
| JP | 4-315270 | 11/1992 |
| JP | 5-95484 | 4/1993 |
| JP | 5-347710 | 12/1993 |
| JP | 6-178282 | 6/1994 |
| JP | 6-232765 | 8/1994 |
| JP | 6-343168 | 12/1994 |
| JP | 7-59086 | 3/1995 |
| JP | 8-186722 | 7/1996 |
| JP | 8-214310 | 8/1996 |
| JP | 9-172379 | 6/1997 |
| JP | 9-307901 | 11/1997 |
| JP | 11-243343 | 9/1999 |
| JP | 11-341497 | 12/1999 |
| JP | 2001-24515 | 1/2001 |
| KR | 1998-0006957 | 3/1998 |
| KR | 1999-0066516 | 8/1999 |

OTHER PUBLICATIONS

Supplementary European Search Report issued Aug. 26, 2004 in corresponding European Application No. 03 720 906.

European Office Action issued Feb. 7, 2006 in corresponding European Application No. 03 720 906.

Kuduvalli G. R., et al., "Performance Analysis of Reversible Image Compression Techniques for High-Resolution Digital Teleradiology", IEEE Transactions on Medical Imaging, IEEE Inc., New York, US, vol. 11, No. 3, Sep. 1, 1992, p. 430-445, XP000306334.

F. Hartung, et al. "Improved Encoding of DCT Coefficients for Low Bit-Rate Video Coding Using Multiple VLC Tables", Image Processings, 1999. ICIP 99. Proceedings. 1999 International Conference on Kobe, Japan, Oct. 24-28, 1999, Piscataway, NJ, USA, IEEE, US, pp. 51-55.

ITU-T Recommendation H.263: *Video Coding for Low Bit Rate Communication*, 1998, Annex E.

* cited by examiner

Fig.1

| Absolute value of coefficient value L | Binary data |
|---|---|
| 1 | 1 |
| 2 | 01 |
| 3 | 001 |
| 4 | 0001 |
| 5 | 00001 |
| 6 | 000001 |
| 7 | 0000001 |
| 8 | 00000001 |
| 9 | 000000001 |
| 10 | 0000000001 |
| ... | ... |

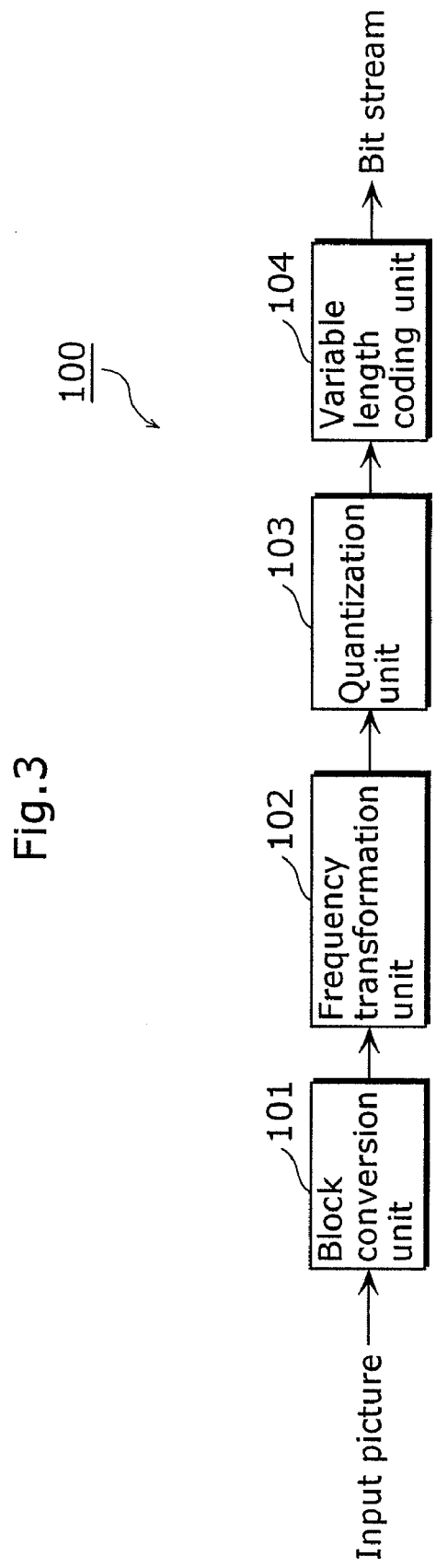

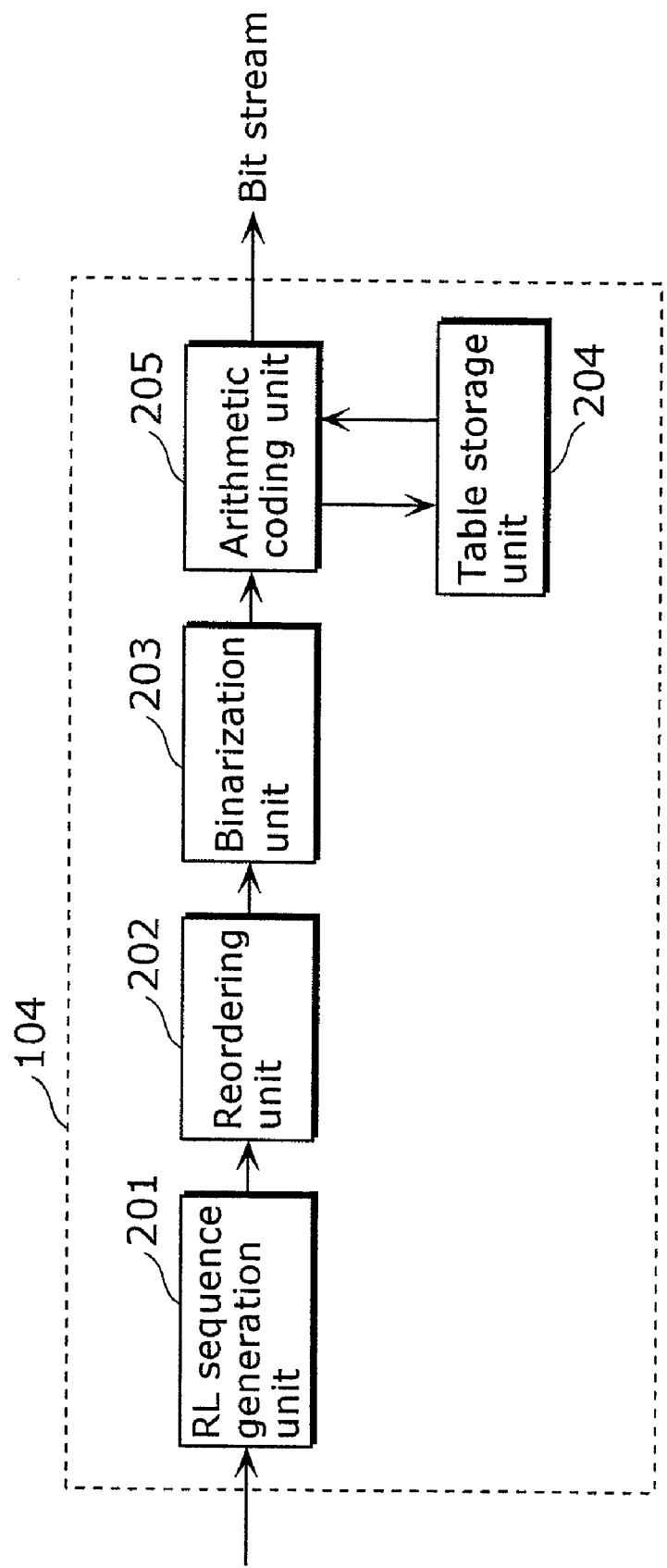

Fig.5A

|  |  |  |  |
|---|---|---|---|
| -38 | 9 | 7 | 0 |
| -5 | -31 | 2 | 0 |
| 22 | -12 | -2 | 0 |
| 6 | 3 | 0 | 0 |

|  |  |  |  |  |
|---|---|---|---|---|
| | 11 | | 11 | |
| | (0, -38) | | (0, -2) | -2 |
| | (0, 9) | | (0, 3) | 3 |
| | (0, -5) | | (0, 6) | 6 |
| | (0, 22) | | (0, -12) | -12 |
| Fig.6A | (0, -31) | Fig.6B | (1, 2) | Fig.6C  2 |
| | (0, 7) | | (0, 7) | 7 |
| | (1, 2) | | (0, -31) | -31 |
| | (0, -12) | | (0, 22) | 22 |
| | (0, 6) | | (0, -5) | -5 |
| | (0, 3) | | (0, 9) | 9 |
| | (0, -2) | | (0, -38) | -38 |

Fig.8

| Probability table 1 | [0.1:0.9] |
|---|---|
| Probability table 2 | [0.2:0.8] |
| Probability table 3 | [0.4:0.6] |
| Probability table 4 | [0.7:0.3] |

VARIABLE LENGTH CODING METHOD AND VARIABLE LENGTH DECODING METHOD

This application is a divisional of application Ser. No. 10/481,277, filed Dec. 12, 2003 which is the National Stage of International Application No. PCT/JP03/04804, filed Apr. 16, 2003.

TECHNICAL FIELD

The present invention relates to coding and decoding of picture data, and more particularly to a method of performing arithmetic coding and arithmetic decoding on coefficient values of picture data.

BACKGROUND ART

In moving picture coding processing, information is generally compressed utilizing spatial and temporal redundancy included in a moving picture. Usually, transformation into the frequency domain is used as a method of utilizing spatial redundancy, while inter picture prediction coding is used as a method of utilizing temporal redundancy.

In the H.263 moving picture coding method, a mode using arithmetic coding is employed as a variable length coding method (For example, refer to "ITU-T Recommendation H.263: "Video Coding for Low Bit Rate Communication" (1998), Annex E").

In such variable length coding method, frequency transformation is performed on each block sized 4×4 pixels, and quantization is further performed on such block to generate coefficient values. Then, scanning is performed starting at a high frequency component toward lower frequency components (direct current components), and combinations of a number R indicating a run of "zeros" and a coefficient value L subsequent to it are generated. Subsequently, after converting (binarizing) numbers R, the absolute values of coefficient values L, and the signs of the coefficient values L into binary data made up of "0"s and "1"s by the use of a binary table, binary arithmetic coding is performed on such binary data by switching between a plurality of probability tables for use. A table shown in FIG. 1 is used, for example, as a binary table for the absolute values of the coefficient values L.

FIG. 1 is a table diagram showing an example binary table.

When binarization is performed on the absolute value "2" of a coefficient value L using the binary table shown in FIG. 1, for example, such absolute value is converted into binary data "01". Also, when performing binarization on the absolute value "3" of a coefficient value L, such absolute value is converted into binary data "001".

When arithmetic coding is performed on binary data derived from the absolute value of a coefficient value L, a probability table is switched to another one based on a transition diagram shown in FIG. 2, depending on the absolute value of the previous coefficient value L.

FIG. 2 is a transition diagram showing a method of switching between probability tables according to an existing technique.

First, arithmetic coding is performed on the absolute value of the first coefficient value L, using a probability table 1. For the subsequent coefficient values L, a probability table is switched to another one depending on the previous coefficient value L of each of such coefficient values L. More specifically, a probability table 2 is used when the absolute value of the previous coefficient value L is 1, a probability table 3 is used when the absolute value of the previous coefficient value L is 2, and a probability table 4 is used when the absolute value of the previous coefficient value L is 3 or a larger value.

In this case, a determination on a probability table depends entirely on the absolute value of the previous coefficient value L.

Also, each of the probability tables itself is updated depending on whether binary data inputted is "0" or "1". In this case, each update is performed in a manner in which the probability of "0" is increased when input binary data is "0" and the probability of "1" is increased when input binary data is "1". Accordingly, adaptations are made on the probability tables so that they will suit the frequency at which binary data is inputted.

In the above existing technique, a probability table is switched to another one depending on the absolute value of the previous coefficient value L. Generally, the absolute values of coefficients on which frequency transformation has been performed tend to be larger in the direction from higher frequency components toward lower frequency components. Thus, there is a problem with the use of the aforementioned existing technique that the switching of a probability table cannot support an increase trend of coefficients in a case where the absolute value of a certain coefficient is smaller than that of the previous coefficient, leading to reduced coding efficiency.

In view of the above problem, it is an object of the present invention to provide a variable length coding method and a variable length decoding method that provide an increased coding efficiency at the time of performing picture coding.

DISCLOSURE OF INVENTION

In order to achieve the above object, the variable length coding method according to the present invention is a variable length coding method for coding absolute values of coefficient values within each of blocks with a predetermined size in picture data on which frequency transformation has been performed on said each of the blocks, the variable length coding method comprising: a coefficient value scanning step of scanning the absolute values of the coefficient values within each of the blocks in a predetermined scanning order starting at a higher-frequency component toward a lower-frequency component; and an arithmetic coding step of performing arithmetic coding on the absolute values of the coefficient values according to the scanning order used in the coefficient value scanning step, by switching between a plurality of probability tables for use, wherein, in the arithmetic coding step, a probability table to be used is switched to another probability table in one direction, when the arithmetic-coded absolute values of the coefficient values include an absolute value exceeding a predetermined threshold value.

Generally, the absolute values of coefficient values are larger toward lower frequency components. Therefore, when scanning is applied to the high-frequency domain and then to the low-frequency domain, it is likely that the absolute values of the coefficient values become larger in such order. Thus, as described above, in the variable length coding method according to the present invention, a probability table to be used is switched to another one in one direction when there exists, in the arithmetic-coded coefficient values, an absolute value that exceeds a predetermined coefficient value. From then on, even if the absolute value of a coefficient value becomes smaller than such predetermined threshold value, such coefficient value will be arithmetic-coded without switching a probability table to be used in the opposite direction. Through this operation, update of a probability table becomes more easily adaptive to inputs of coefficient values whose absolute values generally tend to be larger in the direction from higher-frequency components toward lower-frequency components. This consequently makes it possible for the occurrence probability of symbols ("0" or "1" in binary data) in each probability table to be more biased (i.e. the occurrence probability of either "0" or "1" becomes a value closer to 1.0). Arithmetic coding has a characteristic that the more biased probability values in a probability table are, the higher the coding efficiency becomes. Accordingly, the use of the variable length coding method according to the present invention results in an improved coding efficiency.

Also, the variable length decoding method according to the present invention is a variable length decoding method for decoding a bit stream which is generated by coding absolute values of coefficient values within each of blocks with a predetermined size in picture data on which frequency transformation has been performed on said each of the blocks after one-dimensionalizing said absolute values, the variable length decoding method comprising: an arithmetic decoding step of arithmetic decoding the bit stream into absolute values of a plurality of coefficient values on a one-by-one basis, by switching between a plurality of probability tables for use; and a coefficient generation step of converting the absolute values of the coefficient values decoded in the arithmetic decoding step into the absolute values of the coefficient values within each of the blocks, according to a predetermined scanning order starting at a higher-frequency component toward a lower-frequency component, wherein, in the arithmetic decoding step, a probability table to be used is switched to another probability table in one direction, when the arithmetic-decoded absolute values of the coefficient values include an absolute value exceeding a predetermined threshold value.

Accordingly, it becomes possible to properly decode a bit stream coded by the use of the variable length coding method according to the present invention.

Note that the present invention can be realized not only as a variable length coding method and a variable length decoding method as described above, but also as a variable length coding apparatus and a variable length decoding apparatus that have, as their steps, the characteristic steps included in the above variable length coding method and variable length decoding method, and realized as a picture coding apparatus and a picture decoding apparatus for coding and decoding a moving picture being equipped with the above apparatuses, as well as being realized as a program that causes a computer to execute such characteristic steps. And it should be noted that such program can be distributed via recording media including CD-ROM and the like, and transmission media including the Internet and the like.

BRIEF DESCRIPTION OF DRAWINGS

FIG. 1 is a table diagram showing an example binary table.

FIG. 3 is a block diagram showing a configuration of a picture to coding apparatus according to a first embodiment of the present invention.

FIG. 4 is a block diagram showing an internal configuration of a variable length coding unit according to the first embodiment of the present invention.

FIG. 5A and FIG. 5B are schematic diagrams schematically showing coefficient blocks outputted by a quantization unit according to the first embodiment of the present invention.

FIG. 6A, FIG. 6B, and FIG. 6C are schematic diagrams schematically showing RL sequences outputted by an RL sequence generation unit according to the first embodiment of the present invention.

FIG. 8 is a probability table contents diagram showing the contents of a probability table according to the first embodiment of the present invention.

BEST MODE FOR CARRYING OUT THE INVENTION

First Embodiment

Figure 2:
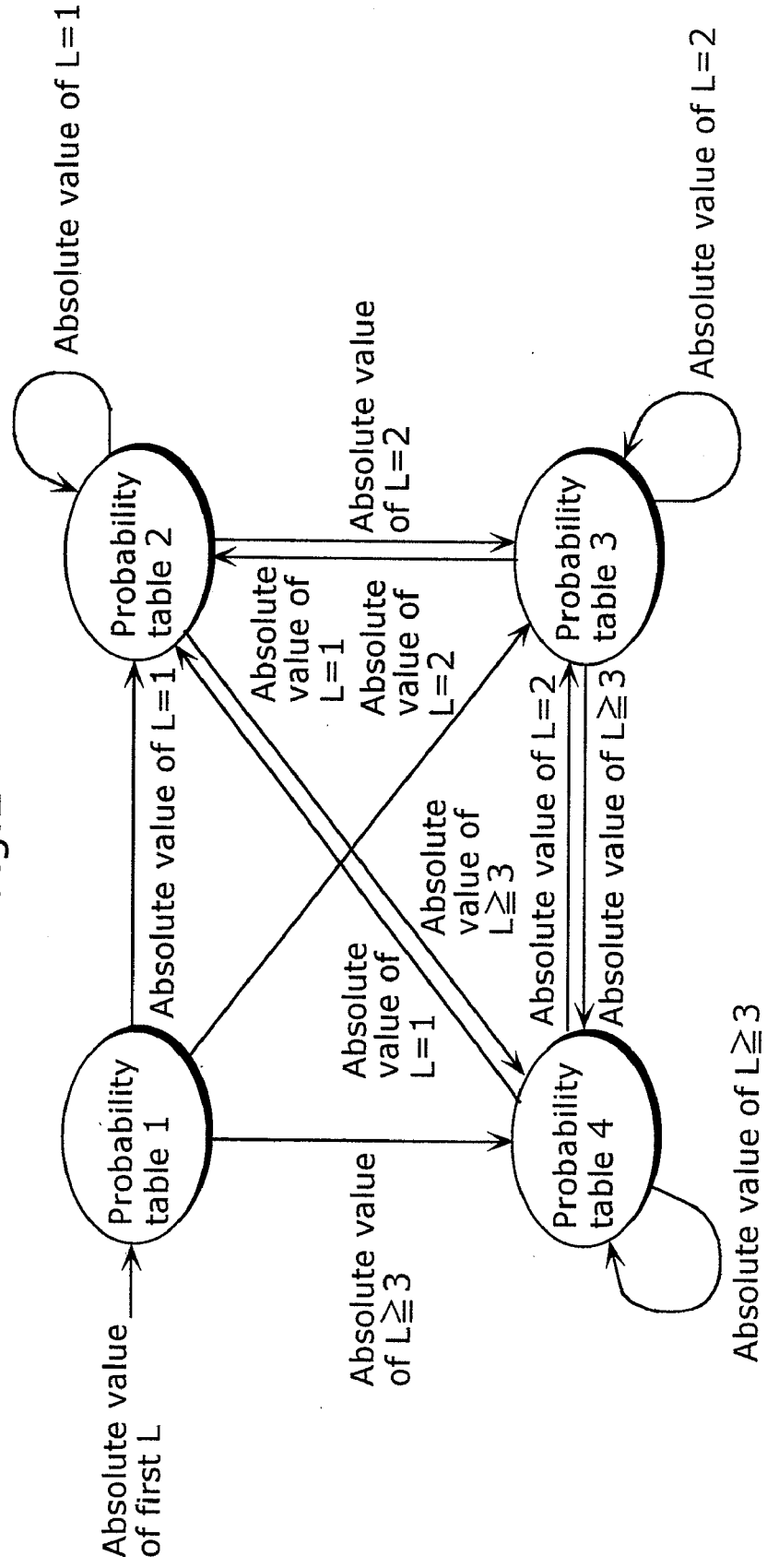
FIG. 2 is a transition diagram showing a method of switching between probability tables according to an existing technique.

The following explains a picture coding apparatus according to the first embodiment of the present invention with reference to the figures.

FIG. 3 is a block diagram showing the configuration of a picture coding apparatus 100 according to the first embodiment of the present invention.

This picture coding apparatus 100, which performs intra picture coding on an input picture (picture data) with improved coding efficiency, is comprised of a block conversion unit 101, a frequency transformation unit 102, a quantization unit 103, and a variable length coding unit 104.

The block conversion unit 101 divides an input picture into pixel blocks with a size of 4×4 pixels in horizontal and vertical directions, and outputs them to the frequency transformation unit 102.

The frequency transformation unit 102 performs frequency transformation on each of the above-divided pixel blocks so as to generate frequency coefficients. Then, the frequency transformation unit 102 outputs such generated frequency coefficients to the quantization unit 103.

The quantization unit 103 performs quantization on the frequency coefficients outputted by the frequency transformation unit 102. Quantization here means processing equivalent to dividing a frequency coefficient by a predetermined quantization value. Moreover, a quantization value varies depending generally on a pixel block and a frequency band. Subsequently, the quantization unit 103 outputs the quantized frequency coefficients to the variable length coding unit 104.

The variable length coding unit 104 performs variable length coding on the frequency coefficients quantized by the quantization unit 103.

FIG. 4 is a block diagram showing an internal configuration of the variable length coding unit 104.

As shown in FIG. 4, the variable length coding unit 104 is made up of an RL sequence generation unit 201, a reordering unit 202, a binarization unit 203, a table storage unit 204, and an arithmetic coding unit 205.

The RL sequence generation unit 201 converts the quantized frequency coefficients (to be abbreviated as "coefficients" hereinafter) outputted by the quantization unit 103 into one-dimensional coefficients, using a predetermined scanning method. Then, the RL sequence generation unit 201 generates a sequence (to be referred to as "RL sequence" hereinafter) made up of combinations of a number R indicating a run of "zero" coefficients and the subsequent coefficient value L indicating a non-"zero" coefficient (to be referred to as "RL values" hereinafter). Referring to FIGS. 5 and 6, an example of this is explained.

FIG. 5A shows a coefficient block made up of a plurality of coefficients outputted by the quantization unit 103. Here, the upper left frequency coefficient denotes a direct-current component, and frequency components in the horizontal direction become larger toward right, while frequency components in the vertical direction become larger downward.

FIG. 5B is an explanation diagram for explaining a scanning method for one-dimensionalizing a plurality of coefficients within a coefficient block. As indicated by arrows in FIG. 5B, the RL sequence generation unit 201 one-dimensionalizes coefficients by performing scanning within the coefficient block starting from the low-frequency domain toward the high-frequency domain.

FIG. 6A shows an RL sequence outputted by the RL sequence generation unit 201. In FIG. 6A, the first number indicates the number of coefficients. Generally, a coefficient value is more likely to be "0" in the high-frequency domain. Therefore, by performing scanning starting from the low-frequency domain toward the high-frequency domain, it is possible to reduce the amount of information included in an RL sequence (of which, the amount of information of the numbers R). The generated RL sequence is inputted to the reordering unit 202.

The reordering unit 202 sorts the inputted RL sequence in reverse order. However, the number of coefficients shall not be reordered.

FIG. 6B shows the RL sequence reordered by the reordering unit 202. By performing reordering in this way, it is possible to reduce the amount of information just as described above, and consequently to one-dimensionalize coefficients by applying scanning to the coefficient block from the high-frequency domain toward the low-frequency domain. Subsequently, the RL sequence reordered in the above manner is outputted to the binarization unit 203.

The binarization unit 203 performs binarization on the number of coefficients and each RL value, i.e. converts them into binary data made up of "0"s and "1"s. Here, the numbers R and coefficient values L are binarized separately.

FIG. 6C shows only the coefficient values L in the RL sequence reordered by the reordering unit 202. The absolute values and signs of these coefficient values L are separately processed. Moreover, the binarization unit 203 performs binarization on the numbers R and the absolute values of the coefficient values L, using a predetermined binary table as shown in FIG. 1, for example. Then, the binarization unit 203 outputs, to the arithmetic coding unit 205, binary data resulted from performing binarization on them.

The arithmetic coding unit 205 performs binary arithmetic coding on the numbers R and the absolute values of the coefficient values L represented as binary data, while at the same time coding the signs of the coefficient values L. An explanation is given here of arithmetic coding to be performed on the absolute value of a coefficient value L. The arithmetic coding unit 205 uses a plurality of probability tables by switching between them, when performing arithmetic coding on the absolute value of a coefficient value L represented as binary data. Such plurality of probability tables are stored by the table storage unit 204.

Figure 7:
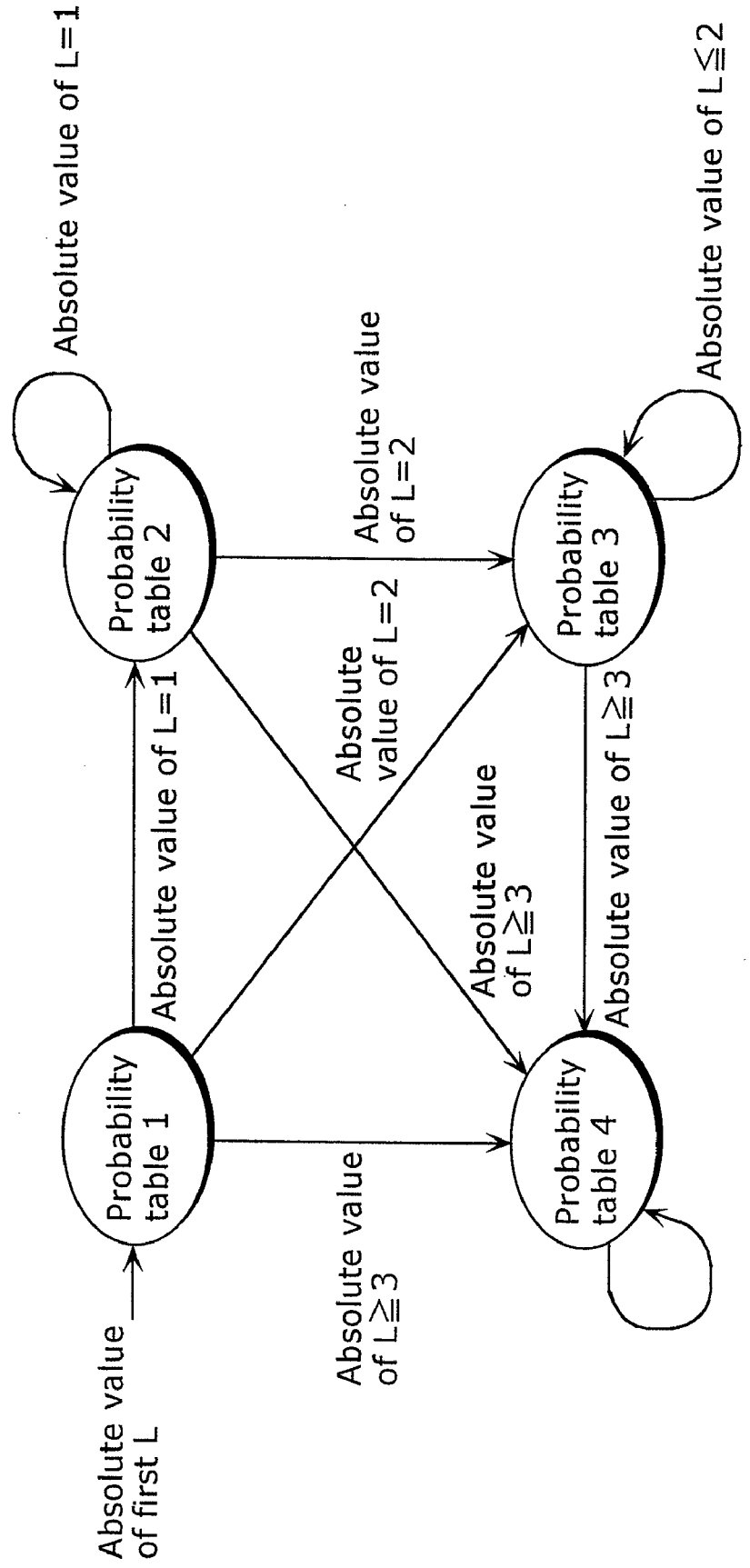
FIG. 7 is a transition diagram showing a method of switching between probability tables according to the first embodiment of the present invention.

FIG. 7 is a transition diagram showing a method of switching between probability tables.

As FIG. 7 shows, the arithmetic coding unit 205 uses four probability tables, out of which the probability table 1 is used to perform arithmetic coding on the absolute value of the first coefficient value L. Meanwhile, for a subsequent coefficient value L, the arithmetic coding unit 205 switches to another probability table for use, depending on the table number of a probability table used for coding the absolute value of the previous coefficient value L as well as on such absolute value. Here, four probability tables are the probability table 1, the probability table 2, the probability table 3, and the probability table 4, and the table number of the probability table 1 is "1", the table number of the probability table 2 is "2", the table number of the probability table 3 is "3", and the table number of the probability table 4 is "4".

More specifically, the probability table 2 is used when one of the following is satisfied: when the probability table 1 is used to code the absolute value of the previous coefficient value L and its absolute value is "1"; and when the probability table 2 is used to code the absolute value of the previous coefficient value L and its absolute value is "1". Meanwhile, the probability table 3 is used when one of the following is satisfied: when the probability table 1 is used to code the absolute value of the previous coefficient value L and its absolute value is "2"; when the probability table 2 is used to code the absolute value of the previous coefficient value L and its absolute value is "2"; and when the probability table 3 is used to code the absolute value of the previous coefficient value L and its absolute value is "2 or smaller". And, the probability table 4 is used when one of the following is satisfied: when the absolute value of the previous coefficient value L is "3 or a larger value"; and when the probability table 4 is used to code the absolute value of the previous coefficient value L.

As described above, the probability tables are switched in one direction, that is, from a probability table with a smaller table number to a probability table with a larger table number. Accordingly, even when the absolute value of the previous coefficient value L is equal to or smaller than a predetermined threshold value, the probability tables shall not be switched in the opposite direction. This is the point that distinguishes the present invention from the existing technique.

FIG. 8 is a probability table contents diagram showing the contents of the aforementioned four tables 1~4.

As shown in FIG. 8, each of the four probability tables 1~4 is made up of the probability with which "0" occurs and the probability with which "1" occurs.

For example, the probability table 1 is made up of the probability "0.1" with which "0" occurs and the probability "0.9" with which "1" occurs, and the probability table 2 is made up of the probability "0.2" with which "0" occurs and the probability "0.8" with which "1" occurs.

To put it another way, when the absolute value of a coefficient value L is "2", the result of binarizing "2" is "01", and therefore, when using the probability table 1 to perform arithmetic coding on "01", the arithmetic coding unit 205 performs arithmetic coding on "01" using the probability "0.1" corresponding to "0" in such "01" and the probability "0.9" corresponding to "1" in such "01".

Here, since the sum of the probability with which "0" occurs and the probability with which "1" occurs is 1.0, it is not necessary to hold both of these probabilities, and therefore only either of the probabilities may be retained.

The following explains an example method of switching between probability tables in a case where coding is performed on the absolute values (binarized ones) of the coefficient values L shown in FIG. 6C.

The arithmetic coding unit 205 uses the probability table 1 for the absolute value of the first coefficient value L (−2). Here, since the absolute value of such coefficient value L is 2, the arithmetic coding unit 205 switches the probability table 1 to the probability table 3 for use. Accordingly, the arithmetic coding unit 205 uses the probability table 3 to perform arithmetic coding on the absolute value of the second coefficient value L (3). Here, since the absolute value of such coefficient value L is "3", the arithmetic coding unit 205 switches the probability table 3 to the probability table 4 for use. Accordingly, the arithmetic coding unit 205 uses the probability table 4 to perform arithmetic coding on the absolute value of the third coefficient value L (6). Here, since the probability table to be used has been switched to the probability table 4, the arithmetic coding unit 205 uses the probability table 4 to perform arithmetic coding on the absolute values of all subsequent coefficient values L. For example, the absolute value of the fifth coefficient value L is "2", but unlike the existing technique, the arithmetic coding unit 205 uses the probability table 4 when performing arithmetic coding on the absolute value of the sixth coefficient value L and thereafter, without switching to another probability table.

Furthermore, since each of the probability tables are updated as needed depending on whether an input is "0" or "1", such probability tables are updated to adapt to inputs.

As described above, in the variable length coding method employed by the variable length coding unit 104 in the picture coding apparatus 100 according to the present invention, one-dimensionalization is performed on coefficients within a coefficient block by scanning them starting from the low-frequency domain toward the high-frequency domain. Then, it generates a sequence of RL values (RL sequence) made up of combinations of a number R indicating a run of "zero" coefficient values and a non-"zero" coefficient value L subsequent to it. Such RL values are then converted into variable length codes in an order opposite to the one in which the scanning has been applied. When the RL values are converted into variable length codes, numbers R, the absolute values of coefficient values L and the signs of the coefficient values L are converted separately. When they are converted, binarization is performed first, which is followed by arithmetic coding. In order to perform arithmetic coding on the absolute values of the coefficient values L, a plurality of probability tables are switched between them. When a probability table is switched to another probability table, a probability table to be used for coding the absolute value of the next coefficient value L is determined depending on the table number of the current probability table and the absolute value of the current coefficient value L. The probability tables shall be switched only in one direction, and once the absolute value of a coefficient value L exceeds a predetermined value, the same probability table is used from then on for performing arithmetic coding.

When scanning is applied from the high-frequency domain first and then to the low-frequency domain, it is likely that the absolute values of the coefficient values L become larger in such order, since the absolute values of coefficient values L are generally larger toward the low-frequency domain. Therefore, once the absolute value of a coefficient value L exceeds a predetermined value, even if the absolute value of another coefficient value L becomes smaller than such predetermined value after that, it is highly possible that only the absolute value of such coefficient value is small. Thus, by performing arithmetic coding by the use of the same probability table, update of a probability table becomes more easily adaptive to inputs. This consequently makes it possible for the occurrence probability of symbols ("0" or "1" in binary data) in each probability table to be more biased (i.e. the occurrence probability of either "0" or "1" becomes a value closer to 1.0). Arithmetic coding has a characteristic that the more biased probability values in a probability table are, the higher the coding efficiency becomes. Accordingly, the use of the variable length coding method according to the present invention results in an improved coding efficiency.

(Variation)

Next, an explanation is give of a variation of the picture coding apparatus according to the present embodiment.

First, the variation is explained concerning the switching of probability tables.

An arithmetic coding unit in the picture coding apparatus according to this variation performs arithmetic coding on the absolute values of coefficient values L (binarized one) by switching between the two probability tables 1 and 4 for use.

Figure 9:
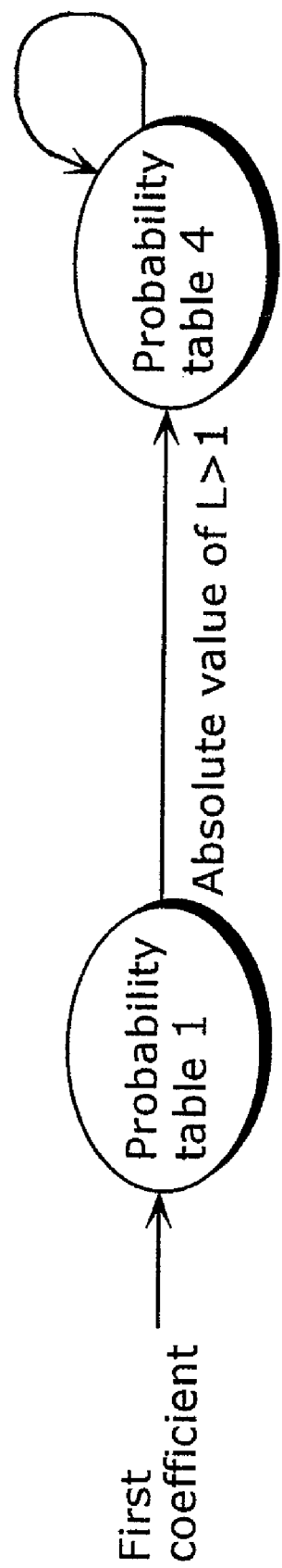
FIG. 9 is a transition diagram showing a method of switching between the probability tables employed by an arithmetic coding unit according a variation of the present invention.

FIG. 9 is a transition diagram showing a method of switching between the probability tables used by the arithmetic coding unit according to the variation.

As shown in FIG. 9, the arithmetic coding unit uses two probability tables, and uses the probability table 1 to perform arithmetic coding on the absolute value of the first coefficient value L. Then, the arithmetic coding unit switches from the probability table 1 to the probability table 4 when the absolute value of the previous coefficient value L exceeds "1", and uses the probability table 4 to perform arithmetic coding on the absolute values of all the subsequent coefficient values L to be coded. In other words, the arithmetic coding unit uses the probability table 1 to perform arithmetic coding on the absolute value of a coefficient value L to be coded when there is no coefficient value L with an absolute value exceeding "1" in arithmetic-coded coefficient values L. On the other hand, the arithmetic coding unit switches from the probability table 1 to the probability table 4 when there exists, in arithmetic-coded coefficient values L, a coefficient value L with an absolute value exceeding "1", i.e. when the number of coefficient values L with an absolute value exceeding "1" becomes a value other than zero, so as to perform arithmetic coding on the absolute values of all the subsequent coefficient values L to be coded using the probability table 4.

Here, an explanation is given below of an example of switching between the probability tables in a case where coefficient values L are "−1, 1, −2, 3, 4, 4, 1" starting from the high-frequency domain down to the low-frequency domain. The arithmetic coding unit uses the probability table 1 for the absolute value of the first coefficient value L (−1). Here, since the absolute value of such coefficient value L is "1" which does not exceed a threshold value "1", the arithmetic coding unit does not switch the probability table to be used to another one, and continues to use the probability table 1. Accordingly, the arithmetic coding unit uses the probability table 1 to perform arithmetic coding on the absolute value of the second coefficient value L (1). Here, since the absolute value of such coefficient value L is "1", the arithmetic coding unit does not switch the probability table to be used to another one, and continues to use the probability table 1, as in the above case. Accordingly, the arithmetic coding unit uses the probability table 1 to perform arithmetic coding on the absolute value of the third coefficient value L (−2). Here, since the absolute value is "2" which exceeds the threshold value "1", the arithmetic coding unit switches from the probability table 1 to the probability table 4, and uses the probability table 4 to perform arithmetic coding on the absolute value of the fourth coefficient value L (3). Regarding the absolute value of the fifth coefficient value L and thereafter, since there is a coefficient value L with an absolute value exceeding "1" in the arithmetic-coded coefficient values L, the arithmetic coding unit uses the probability table 4 to perform coding on the absolute value of the fifth coefficient value L and thereafter.

As is obvious from FIG. 1, binary data is represented only as "1" when the absolute value of a coefficient value L is "1". Therefore, when "1" is set as a threshold value, adaptations are made to the probability table 1, which is used when such threshold value is not exceeded, so that a symbol (binary data) "1" occurs with a high probability. Accordingly, there will be a significant difference in the occurrence probabilities in the probability table 1, leading to a further improved coding efficiency.

Next, an explanation is given for the case where a plurality of probability tables are used for the absolute value of each coefficient value L (binarized one).

Figure 10:
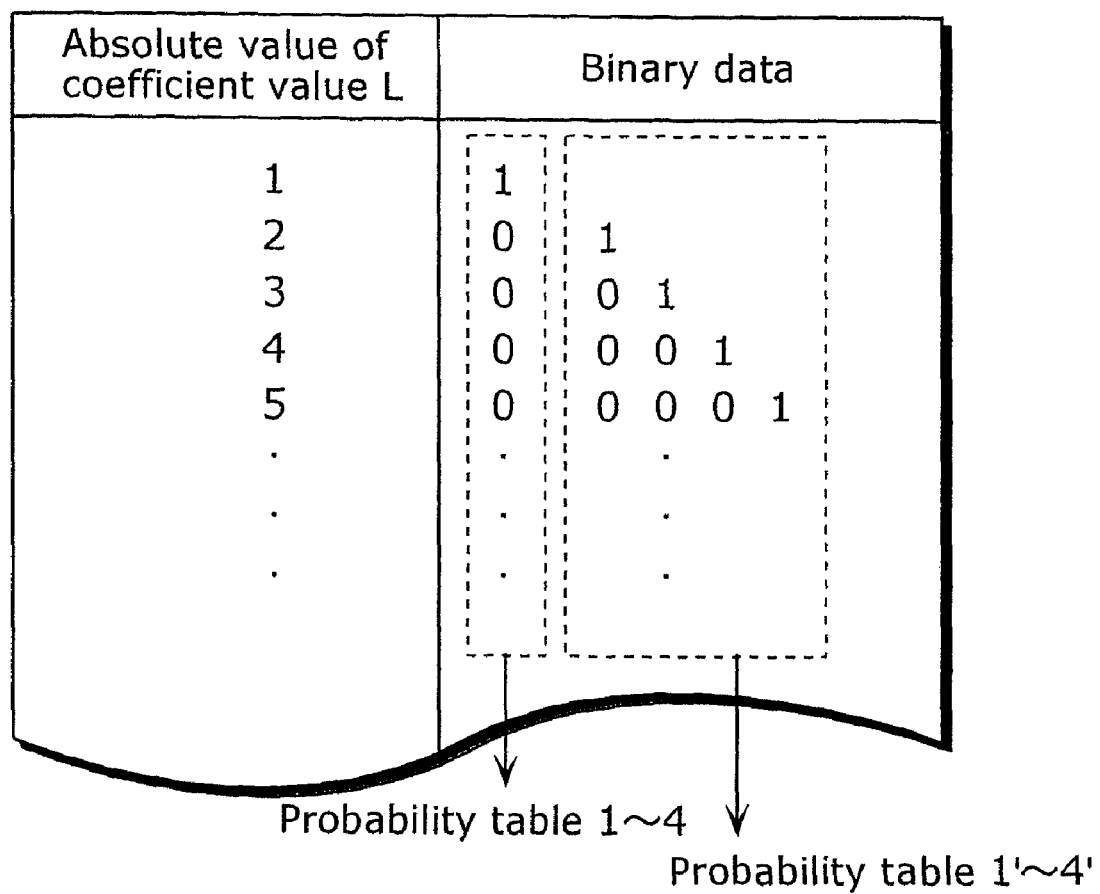
FIG. 10 is an explanation diagram explaining a case where the arithmetic coding unit according to the variation of the present invention uses two probability tables for the absolute value of each coefficient value.

FIG. 10 is an explanation diagram showing the case where two probability tables are used for the absolute value of each coefficient value L.

For example, as shown in FIG. 10, the arithmetic coding unit switches between four probability tables 1~4 so as to use one of these to perform arithmetic coding on the first bit of the absolute value of each coefficient value L represented as binary data, whereas it switches between four probability tables 1'~4' different from the above probability tables 1~4 so as to used it to perform arithmetic coding on the second bit and each of the subsequent bits. Here, the probability table 1' corresponds to the probability table 1, the probability table 2' corresponds to the probability table 2, the probability table 3' corresponds to the probability table 3, and the probability table 4' corresponds to the probability table 4. In other words, as in the case of the preferred embodiment explained with reference to FIG. 7, a probability table to be used is changed depending on the maximum value of the absolute values of the coded coefficients until the previous one, but in so doing, a probability table used to code the first bit and the probability tables used to code the second bit and thereafter are changed at the same time.

Assume that the same threshold value and the numbers of the probability tables corresponding to such threshold value as those used for the preferred embodiment explained with reference to FIG. 7 are used. Unlike the case where all bits are coded using the same probability table, in the probability tables 1 and 2, a probability at which "1" is more likely to occur is set high (in order to adapt to inputs), and in the probability tables 3 and 4, a probability at which "0" is more likely to occur is set high. Similarly, regarding the probability tables 1'~4', in the probability tables 1'~3', a probability at which "1" is more likely to occur is set high (in order to adapt to inputs), and in the probability table 4, a probability at which "0" is more likely to occur is set high. In arithmetic coding, the bigger a difference in the occurrence probabilities of symbols ("0" or "1" in binary data) stored in probability tables (i.e. the closer the occurrence probability of either "0" or "1" is to 1.0), the higher the coding efficiency becomes. This consequently leads to a further improved coding efficiency. In this case, in addition to dividing binary data into the first bit and the bits thereafter, binary data may also be divided at another bit position, and may be divided into three or more by bit positions. Moreover, instead of using the same number of probability tables for each of the divided bit positions, it is also possible, for example, that a plurality of probability tables are used for the first bit and the same probability table is used for the second bit and the subsequent bits (i.e. the same probability table is used regardless of coefficients). When a same number of probability tables are used for each of the divided bit positions as in the case of the aforementioned embodiment, they may be switched between them according to a different reference (threshold value) (i.e. at a different timing), instead of being switched according to the same reference.

The picture coding apparatus according to the present invention has been explained using the above embodiment and variation, but the present invention is not limited to them.

In the present embodiment and variation, for example, an explanation is provided for the case where a picture is coded by means of intra picture coding, but the same effect can be achieved also for the case where a picture is coded by means of inter picture coding by performing motion compensation and others on an input moving picture.

Furthermore, in the present embodiment and variation, although an explanation is given for the case where an input picture is divided into pixel blocks of 4×4 pixels in horizontal and vertical directions, a pixel block may be with a different size.

Also, in the present embodiment and variation, although FIG. 5B is used to explain a method of performing scanning within a coefficient block, another scanning order may also be employed as long as scanning is performed from the low-frequency domain toward the high-frequency domain.

Moreover, in the present embodiment and variation, an explanation is given for the case where the RL sequence generation unit 201 converts quantized frequency coefficients into one-dimensional coefficients using a predetermined scanning method, and generates a sequence (RL sequence) made up of combinations of a number R indicating a run of zero coefficient values and a non-zero coefficient value L subsequent to it, but a sequence of numbers R and coefficient values L may be generated separately. When a sequence of coefficient values L is generated, for example, the reordering unit 202 may be omitted, if such sequence is generated by performing scanning starting from the high-frequency domain to the low-frequency domain and by selecting coefficients with coefficient values other than zero.

Furthermore, an explanation is given in the present embodiment for the case where four probability tables are used and such probability tables are switched according to the transition table illustrated in FIG. 7, and an explanation is given in the variation for the case where two probability tables are used and such probability tables are switched according to the transition table illustrated in FIG. 9, but different values may be employed as the number of probability tables and as a threshold value for the absolute values of coefficient values L when probability tables are switched as illustrated in FIGS. 7 and 9.

Also, FIG. 1 is presented as an example of a binary table, but another table may be employed.

Furthermore, in the present embodiment and variation, although an explanation is given for the case where the arithmetic coding unit performs binary arithmetic coding, multi-value arithmetic coding may be performed instead. In such case, it is possible to omit the binarization unit 203.

Second Embodiment

The following explains a picture decoding apparatus according to the second embodiment of the present invention with reference to the figures.

Figure 11:
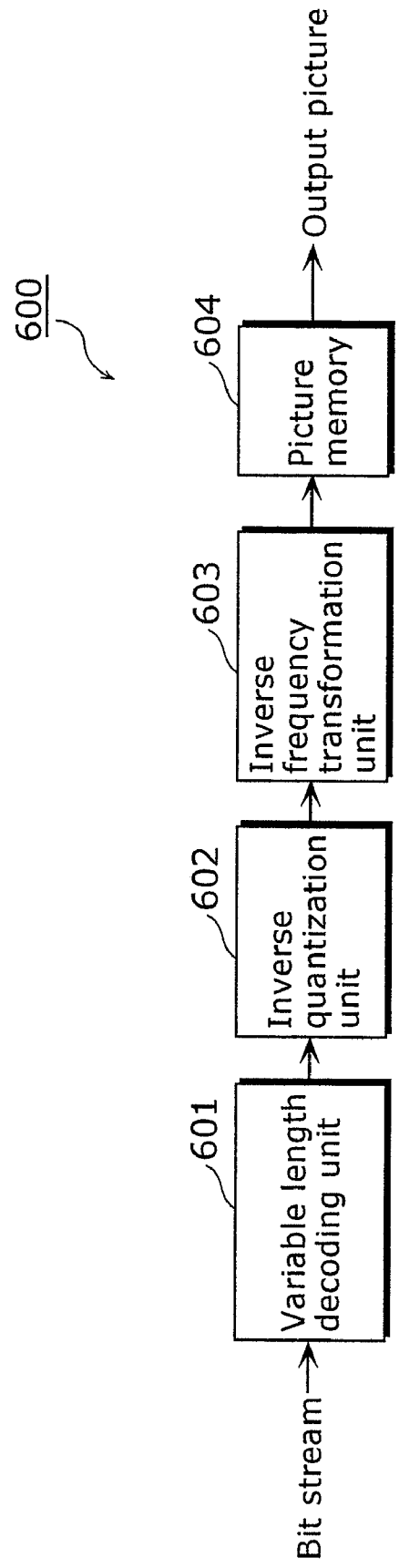
FIG. 11 is a block diagram showing a configuration of a picture decoding apparatus according to a second embodiment of the present invention.

FIG. 11 is a block diagram showing the configuration of a picture decoding apparatus 600 according to the second embodiment of the present invention.

This picture decoding apparatus 600 performs intra picture decoding on a bit stream resulted from performing intra picture coding on picture data, and is comprised of a variable length decoding unit 601, an inverse quantization unit 602, an inverse frequency transformation unit 603, and a picture memory 604. The bit stream to be inputted here is generated using the variable length coding method employed by the picture coding apparatus 100 according to the first embodiment, and is first obtained by the variable length decoding unit 601.

On the receipt of the bit stream, the variable length decoding unit 601 generates a coefficient block made up of a plurality of coefficients as shown in FIG. 5A by performing variable length decoding on such bit stream.

The inverse quantization unit 602, when receiving the coefficient block from the variable length decoding unit 601, performs inverse quantization on such coefficient block. Inverse quantization here means to integrate a predetermined quantization value to each coefficient in the coefficient block. Generally, a quantization value varies on a coefficient block or a frequency band basis, and is obtained from a bit stream. Subsequently, the inverse quantization unit 602 outputs the inverse-quantized coefficient block to the inverse frequency transformation unit 603.

The inverse frequency transformation unit 603 performs inverse frequency transformation on the inverse-quantized coefficient block, and converts the coefficient block into a pixel block. Then, the inverse frequency transformation unit 603 outputs such converted pixel block to the picture memory 604.

The picture memory 604 stores decoded pixel blocks in sequence, and when pixel blocks equivalent to a picture are stored, it outputs these pixel blocks as an output picture.

Here, a detailed explanation is given of the variable length decoding unit 601 described above.

Figure 12:
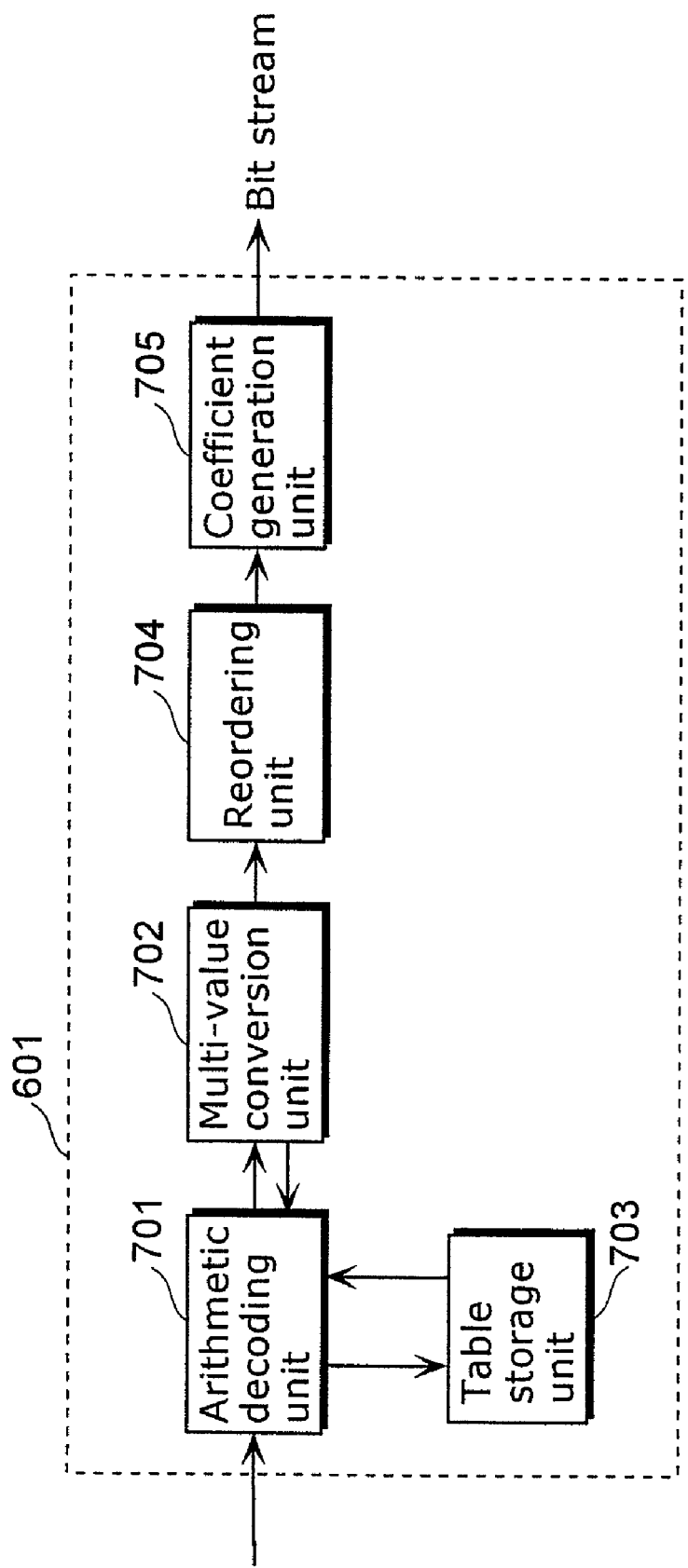
FIG. 12 is a block diagram showing an internal configuration of a variable length decoding unit according to the second embodiment of the present invention.

FIG. 12 is a block diagram showing an internal configuration of the variable length decoding unit 601.

As FIG. 12 shows, the variable length decoding unit 601 is comprised of an arithmetic decoding unit 701, a multi-value conversion unit 702, a table storage unit 703, a reordering unit 704, and a coefficient generation unit 705.

The table storage unit 703 stores four probability tables 1~4 as shown in FIG. 8, for example.

On the receipt of the bit stream, the arithmetic decoding unit 701 first performs arithmetic decoding on such bit stream. Here, an explanation is given of binary arithmetic decoding to be performed on the absolute values (binarized one) of coded coefficient values L included in the bit stream.

When performing arithmetic decoding on the absolute value of a coded coefficient value L, the arithmetic decoding unit 701 obtains, from the multi-value conversion unit 702, the absolute value of the previous coefficient value L which has already been decoded and converted into a multi-value. Then, the arithmetic decoding unit 701 switches between the probability tables 1~4 stored by the table storage unit 703 in a manner as shown in FIG. 7 depending on the absolute value of such coefficient value L, and performs binary arithmetic decoding on the absolute value of each of coded coefficient values L so as to output binary data corresponding to each of them.

The multi-value conversion unit 702 converts the binary data outputted by the arithmetic decoding unit 701 into multi-values, using, for example, a binary table as shown in FIG. 1, so as to represent them as the absolutes value of coefficient values L. Then, the multi-value conversion unit 702 outputs the absolute values of such coefficient values L to the arithmetic decoding unit 701 and the reordering unit 704.

An explanation is given of a detailed operation of the arithmetic decoding unit 701 and the multi-value conversion unit 702.

First, the arithmetic decoding unit 701 uses the probability table 1 to perform arithmetic decoding on the absolute value of the first coded coefficient value L. Then, the arithmetic decoding unit 701 outputs, to the multi-value conversion unit 702, binary data obtained by performing arithmetic decoding. The multi-value conversion unit 702 uses the binary table so as to convert the binary data into the absolute value of the coefficient value L, and outputs such absolute value to the arithmetic decoding unit 701 and the reordering unit 704.

Then, for the absolute values of the subsequent coded coefficient values L, the arithmetic decoding unit 701 switches the probability table to be used to another one, depending on the table number of the probability table used when the absolute value of the previous coded coefficient value L is binary arithmetic decoded as well as on the absolute value of such previous coefficient value L obtained from the multi-value conversion unit 702. As shown in FIG. 7, the probability table 2 is used when one of the following is satisfied: when the probability table 1 was used to perform arithmetic decoding on the absolute value of the previous coded coefficient value L and the absolute value of the previous coefficient value L obtained form the multi-value conversion unit 702 is "1"; and when the probability table 2 was used to perform arithmetic decoding on the absolute value of the previous coded coefficient value L and the absolute value of the previous coefficient value L obtained form the multi-value conversion unit 702 is "1". The probability table 3 is used when one of the following is satisfied: when the probability table 1 was used to perform arithmetic decoding on the absolute value of the previous coded coefficient value L and the absolute value of the previous coefficient value L obtained form the multi-value conversion unit 702 is "2"; when the probability table 2 was used to perform arithmetic decoding on the absolute value of the previous coded coefficient value L and the absolute value of the previous coefficient value L obtained form the multi-value conversion unit 702 is "2"; and when the probability table 3 was used to perform arithmetic decoding on the absolute value of the previous coded coefficient value L and the absolute value of the previous coefficient value L obtained form the multi-value conversion unit 702 is "2 or smaller". And the probability table 4 is used when one of the following is satisfied: when the absolute value of the previous coefficient value L obtained form the multi-value conversion unit 702 is "3 or a larger value"; and when the probability table 4 was used to perform arithmetic decoding on the absolute value of the previous coded coefficient value L. As shown above, the probability tables 1~4 are switched in one direction, that is, from a probability table with a smaller table number to a probability table with a larger table number. Accordingly, even if the absolute value of the previous coefficient value L obtained from the multi-value conversion unit 702 is equal to or smaller than a predetermined threshold value, the probability tables shall not be switched in the opposite direction. This is the point that distinguishes the present invention from the existing technique.

The following explains an example of switching between the probability tables, in a case where decoding is performed into the absolute values of coefficient values L shown in FIG. 6C.

The arithmetic decoding unit 701 uses the probability table 1 to perform arithmetic decoding on the absolute value of the first coded coefficient value L (−2) so as to decode it into binary data "01". Since the arithmetic decoding unit 701 obtains, from the multi-value conversion unit 702, "2" which is a multi-value converted from such binary data "01", it switches from the probability table 1 to the probability table 3 so as to use it. Accordingly, the arithmetic decoding unit 701 uses the probability table 3 to perform arithmetic decoding on the absolute value of the second coded coefficient value L (3) so as to decode it into binary data "001". Here, since the arithmetic decoding unit 701 obtains, from the multi-value conversion unit 702, "3" which is a multi-value converted from such binary data "001", it switches from the probability table 3 to the probability table 4 so as to use it. Accordingly, the arithmetic decoding unit 701 uses the probability table 4 to perform arithmetic decoding on the absolute value of the third coded coefficient value L (6) so as to decode it into binary data "000001". Here, since the probability table to be used is switched to the probability table 4, the arithmetic decoding unit 701 uses the probability table 4 to perform arithmetic decoding on the absolute values of all the subsequent coded coefficient values L. For example, the absolute value of the fifth coded coefficient value L is decoded and converted into a multi-value "2", but unlike the existing technique, the arithmetic decoding unit 701 uses the probability table 4 to perform arithmetic decoding on the absolute value of the sixth coded coefficient value L and thereafter, without switching to another probability table.

Through the above operation, when the absolute values of coefficient values L, the numbers R, and the signs of the coefficient values L equivalent to one coefficient block are generated, they are inputted to the reordering unit 704 as an RL sequence.

The reordering unit 704 sorts such inputted RL sequence in reverse order. However, the number of coefficients shall not be reordered. FIG. 6A illustrates a reordered RL sequence. Subsequently, the reordering unit 704 outputs, to the coefficient generation unit 705, such RL sequence reordered in the above manner.

The coefficient generation unit 705 converts the inputted RL sequence into a coefficient block. In so doing, the coefficient generation unit 705 makes a conversion from the RL sequence into a coefficient block by repeatedly carrying out the following operation: generates a coefficient with the value "0" only by the number indicated by a number R and then generates a coefficient with a value indicated by a coefficient value L. Here, the coefficient generation unit 705 performs zig-zag scanning starting from the low-frequency domain toward the high-frequency domain, so as to convert the RL sequence shown in FIG. 6A into the coefficient block shown in FIG. 5A. Then, the coefficient generation unit 705 outputs, to the inverse quantization unit 602, the coefficient block generated in the above manner.

As described above, in the arithmetic decoding method employed by the variable length decoding unit 601 in the picture decoding apparatus 600 according to the present invention, a plurality of probability tables are switched when arithmetic decoding is performed on the absolute values of coefficient values L included in an input bit stream. When switching to another probability table, which probability table to be used when decoding the absolute value of the next coefficient value L is determined depending on the table number of the current probability table and on the absolute value of a coefficient value L resulted from decoding. When this is done, probability tables are switched only in one direction, and when the absolute value of a coefficient value L resulted from decoding exceeds a predetermined value, the same probability table is used to perform arithmetic decoding on all the subsequent absolute values.

As is obvious from the above, the use of the arithmetic decoding method according to the present invention makes it possible to properly decode a bit stream coded by the use of the variable length coding method according to the present invention.

(Variation)

Next, an explanation is given of a variation of the arithmetic decoding unit in the picture decoding apparatus according to the present embodiment.

First, the variation is explained concerning the switching of probability tables.

An arithmetic decoding unit in the picture decoding apparatus according to this variation performs binary arithmetic decoding on the absolute values of coefficient value L (binarized one) which have been coded by switching between the two probability tables 1 and 4 for use.

As shown in FIG. 9, this arithmetic decoding unit uses two probability tables, and uses the probability table 1 to perform arithmetic decoding on the absolute value of the first coded coefficient value L. Then, the arithmetic decoding unit switches from the probability table 1 to the probability table 4 when the absolute value of the previous coefficient value L exceeds "1", and uses the probability table 4 to perform arithmetic decoding on the absolute values of all the subsequent coefficient values L to be decoded. In other words, the arithmetic decoding unit uses the probability table 1 to perform arithmetic decoding on the absolute value of a coded coefficient value L to be decoded when there is no coefficient value L with an absolute value exceeding "1" in coefficient values L which have been decoded and converted into multi values. On the other hand, the arithmetic decoding unit switches from the probability table 1 to the probability table 4 when there exists, in coefficient values L which have been decoded and converted into multi values, a coefficient value L with an absolute value exceeding "1", i.e. when the number of coefficient values L with an absolute value exceeding "1" becomes a value other than zero, and switches from the probability table 1 to the probability table 4, so as to perform arithmetic decoding on the absolute values of all the subsequent coefficient values L to be decoded using the probability table 4.

Here, an explanation is given below of an example of switching between the probability tables in a case where coefficient values L are "−1, 1, −2, 3, 4, 4, 1" starting from the high-frequency domain down to the low-frequency domain. The arithmetic decoding unit uses the probability table 1 to perform arithmetic decoding on the absolute value of the first coded coefficient value L so as to convert it into binary data "1". Here, since the arithmetic decoding unit obtains, from the multi-value conversion unit 702, "1" which is a multi value converted from such binary data "1", and judges that the absolute value of such coefficient value L is "1" which does not exceed a threshold value "1", it does not switch the probability table to be used, and continues to use the probability table 1. Accordingly, the arithmetic decoding unit performs arithmetic decoding on the absolute value of the second coded coefficient value L so as to convert it into binary data "1", using the probability table 1. Here, since the arithmetic decoding unit judges that the absolute value of such coefficient value L is "1" which does not exceed the threshold value "1", it does not switch the probability table to be used, and continues to use the probability table 1, as in the above case. Accordingly, the arithmetic decoding unit performs arithmetic coding on the absolute value of the third coded coefficient value L so as to convert it into binary data "01", using the probability table 1. Here, the arithmetic decoding unit obtains, from the multi-value conversion unit 702, "2" which is a multi value converted from such binary data "01", and judges that the absolute value is "2" which exceeds the absolute value "1", it switches from the probability table 1 to the probability table 4, and uses the probability table 4 to perform arithmetic decoding on the absolute value of the fourth coded coefficient value L so as to convert it into binary data "0001". Regarding the absolute value of the fifth coded coefficient value L and the absolute values of its subsequent coded coefficient values, since there is a coefficient value L with an absolute value exceeding "1" in coefficient values which have been decoded and converted into multi values, the arithmetic decoding unit performs arithmetic decoding on the absolute value of the fifth coded coefficient value L and the absolute values of all the subsequent coded coefficient values using the probability table 4.

Next, an explanation is given for the case where binary data derived from the absolute value of a coded coefficient value L included in a bit stream is made up of a plurality to elements, and a different probability table is used on an element-by-element basis when binary arithmetic decoding is performed on binary data of the absolute value of such coded coefficient value L.

For example, when binary data of the absolute value of a coded coefficient value L is made up of two elements, the arithmetic coding unit, as shown in FIG. 10, performs arithmetic decoding on one of the two elements in the coded binary data so as to convert it into a numeric value corresponding to the first bit of the binary data, by switching between the four probability tables 1~4 for use. Then, the arithmetic decoding unit performs arithmetic decoding on the other element in the binary data so as to convert it into a numeric value corresponding to the second bit and each of its subsequent bit in the binary data, by switching between the four probability tables 1'~4' for use which are different from the above four probability tables 1~4.

Here, the probability table 1' corresponds to the probability table 1, the probability table 2' corresponds to the probability table 2, the probability table 3' corresponds to the probability table 3, and the probability table 4' corresponds to the probability table 4. In other words, as in the case of the preferred embodiment explained with reference to FIG. 7, a probability table to be used is changed depending on the maximum value of the absolute values of the coded coefficients until the previous one, but in so doing, a probability table used to code the first bit and the probability tables used to code the second bit and thereafter are changed at the same time.

Assume that the same threshold value and the numbers of the probability tables corresponding to such threshold value as those used for the preferred embodiment explained with reference to FIG. 7 is used. In this case, unlike the case where all bits are coded using the same probability table, in the probability tables 1 and 2, a probability at which "1" is more likely to occur is set high (in order to adapt to inputs), and in the probability tables 3 and 4, a probability at which "0" is more likely to occur is set high. Similarly, regarding the probability tables 1'~4', in the probability tables 1'~3', a probability at which "1" is more likely to occur is set high (in order to adapt to inputs), and in the probability tables 4', a probability at which "0" is more likely to occur is set high.

In this case, in addition to dividing binary data into the first bit and the bits thereafter, binary data may also be divided at another bit position, and may be divided into three or more by bit positions. Moreover, instead of using the same number of probability tables for each of the divided bit positions, it is also possible, for example, that a plurality of probability tables are used for the first bit and the same probability table is used for the second bit and the subsequent bits (i.e. the same probability table is used regardless of coefficients). When a same number of probability tables are used for each of the divided bit positions as in the case of the aforementioned embodiment, they may be switched between them according to a different reference (threshold value).

The picture decoding apparatus according to the present invention has been explained in the above using the present embodiment and variation, but the present invention is not limited to them.

In the present embodiment and variation, for example, an explanation is provided for the case where decoding is performed on a bit stream which has been generated by means of intra picture coding, but the same effect can be achieved also for the case where decoding is performed on a bit stream which has been generated by means of inter picture coding by performing motion compensation and others on an input moving picture.

Furthermore, in the present embodiment and variation, although an explanation is given for the case where a bit stream in which picture data is coded being divided into pixel blocks of 4×4 pixels in horizontal and vertical directions, a pixel block may have a different size.

Moreover, an explanation is given in the present embodiment for the case where four probability tables are used and switched according to the transition table illustrated in FIG. 7, and an explanation is given in the variation for the case where two probability tables are used and switched according to the transition table illustrated in FIG. 9, but different values may be employed as the number of probability tables and a threshold value for the absolute values of coefficient values L when probability tables are switched as illustrated in FIGS. 7 and 9.

Also in the present embodiment and variation, although FIG. 5B is used to explain a method of performing scanning within a coefficient block, another scanning order may also be employed as long as it is the same as the scanning method employed at the time of coding.

Furthermore, FIG. 1 is presented as an example of a binary table, but another table may be employed as long as it is the same as the binary table used at the time of coding.

Moreover, although an explanation is given in the present embodiment and variation for the case where the arithmetic decoding unit 701 performs binary arithmetic decoding, multi-value arithmetic decoding may be performed instead. In such case, it is possible to omit the multi-value conversion unit 702.

The Third Embodiment

If a program for realizing the variable length coding method or the variable length decoding method as shown in each of the aforementioned embodiments is recorded on a recording medium such as a flexible disk, it becomes possible to easily perform the processing presented in each of the above embodiments in an independent computer system.

Figure 13A:
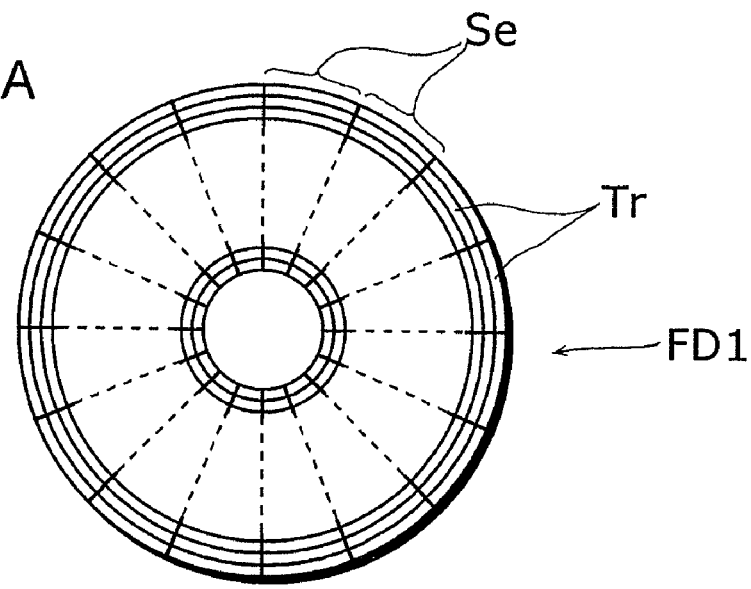
FIG. 13A, FIG. 13B, and FIG. 13C are explanation diagrams showing a recording medium according to a third embodiment of the present invention.
Figure 13B:
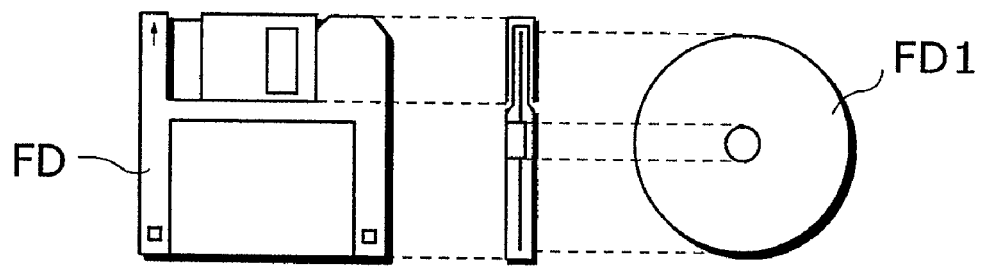
Figure 13C:
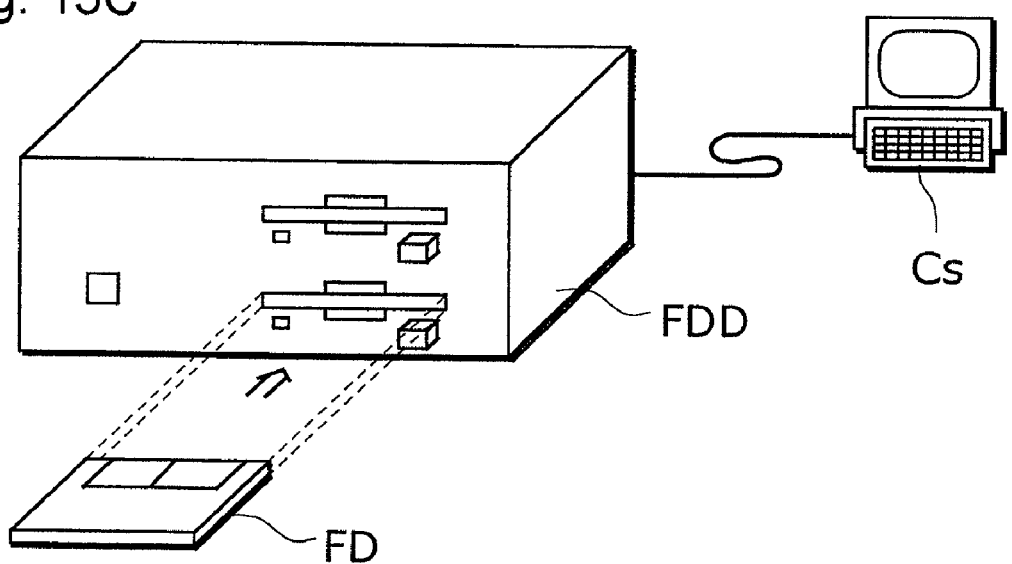

FIGS. 13A, 13B, and 13C are diagrams explaining a recording medium that stores a program for realizing the variable length coding method and the variable length decoding method carried out by the picture coding apparatus 100 and the picture decoding apparatus 600 according to the first and second embodiments.

FIG. 13B shows an external view of a flexible disk FD viewed from the front, a schematic cross-sectional view and a disk body FD1, while FIG. 13A illustrates an example physical format of the disk body FD1 as a recording medium itself.

The disk body FD1 is contained in a case F, and a plurality of tracks Tr are formed concentrically on the surface of the disk body FD1 in the radius direction from the periphery, each track being divided into 16 sectors Se in the angular direction. Therefore, in the flexible disk FD storing the above-mentioned program, the variable length coding method or the variable length decoding method as such program is recorded in an area allocated for it on the disk body FD1.

FIG. 13C shows the structure for recording and reading out the program on and from the flexible disk FD.

When the program is recorded on the flexible disk FD, the variable length coding method or the variable length decoding method as the above program is written by the use of the computer system Cs via a flexible disk drive FDD. Meanwhile, when the variable length coding method or the variable length decoding method is constructed in the computer system Cs through the program on the flexible disk FD, the program is read out from the flexible disk FD via the flexible disk drive FDD and transferred to the computer system Cs.

The above explanation is made on the assumption that a recording medium is a flexible disk FD, but an optical disc may also be used. In addition, the recording medium is not limited to this, and any other medium such as an IC card and a ROM cassette capable of recording a program can also be used.

Fourth Embodiment

The following explains applications of the variable length coding method and the variable length decoding method as shown in the above embodiments as well as a system using them.

Figure 14:
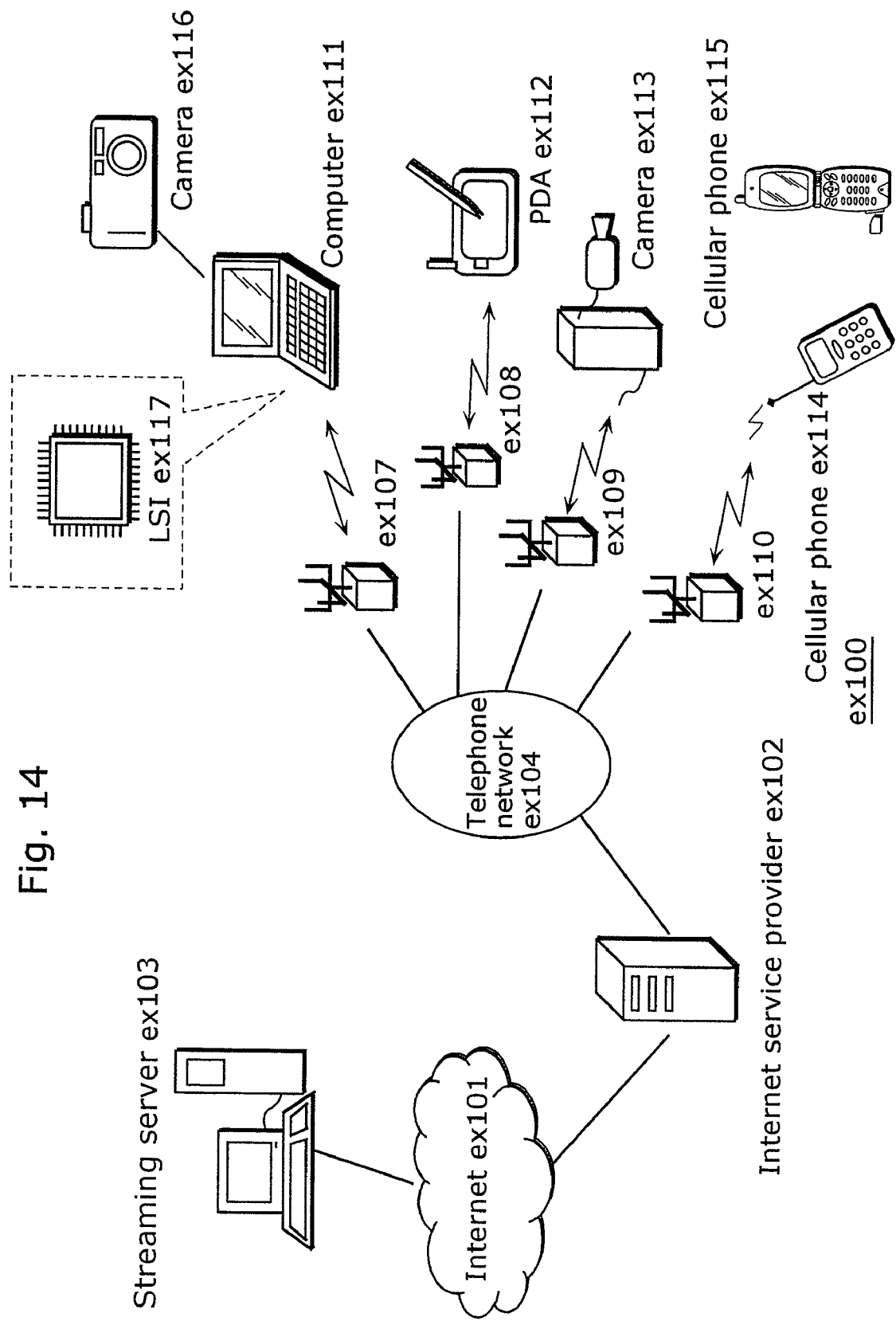
FIG. 14 is a block diagram showing an overall configuration of a content supply system according to a fourth embodiment of the present invention.

FIG. 14 is a block diagram showing an overall configuration of a content supply system ex100 for realizing a content distribution service. The area for providing a communication service is divided into cells of desired size, and base stations ex107~ex110, which are fixed wireless stations, are placed in respective cells.

In this content supply system ex100, devices such as a computer ex111, a PDA (Personal Digital Assistant) ex112, a camera ex113, a cellular phone ex114, and a camera-equipped cellular phone ex115 are respectively connected to the Internet ex101 via an Internet service provider ex102, a telephone network ex104, and the base stations ex107~ex110.

However, the content supply system ex100 is not limited to to the combination as shown in FIG. 14, and may be connected to a combination of any of them. Also, each of the devices may be connected directly to the telephone network ex104, not via the base stations ex107~ex110, which are fixed wireless stations.

The camera ex113 is a device such as a digital video camera capable of shooting moving pictures. The cellular phone may be a cellular phone of a PDC (Personal Digital Communication) system, a CDMA (Code Division Multiple Access) system, a W-CDMA (Wideband-Code Division Multiple Access) system or a GSM (Global System for Mobile Communications) system, a PHS (Personal Handyphone system) or the like, and may be any one of these.

Furthermore, a streaming server ex103 is connected to the camera ex113 via the base station ex109 and the telephone network ex104, which enables live distribution or the like based on coded data transmitted by the user using the camera ex113. Either the camera ex113 or a server and the like capable of data transmission processing may code the shot data. Also, moving picture data shot by a camera ex116 may be transmitted to the streaming server ex103 via the computer ex111. The camera ex116 is a device such as a digital camera capable of shooting still pictures and moving pictures. In this case, either the camera ex116 or the computer ex111 may code the moving picture data. An LSI ex117 included in the computer ex111 or the camera ex116 performs coding processing. Note that software for coding and decoding pictures may be integrated into a certain type of storage medium (such as a CD-ROM, a flexible disk and a hard disk) that is a recording medium readable by the computer ex111 and the like. Furthermore, the camera-equipped cellular phone ex115 may transmit the moving picture data. This moving picture data is data coded by an LSI included in the cellular phone ex115.

In the content supply system ex100, content (e.g. a music live video) which has been shot by the user using the camera ex113, the camera ex116 or the like is coded in the same manner as the above-described embodiments and transmitted to the streaming server ex103, and the streaming server ex103 makes stream distribution of the content data to clients at their request. The clients include the computer ex111, the PDA ex112, the camera ex113, the cellular phone ex114 and so forth capable of decoding the above coded data. The content supply system ex100 with the above structure is a system that enables the clients to receive and reproduce the coded data and realizes personal broadcasting by allowing them to receive, decode and reproduce the data in real time.

The picture coding apparatus and the picture decoding apparatus presented in the above embodiments can be used for coding and decoding to be performed in each of the devices making up the above system.

An explanation is given of a cellular phone as an example.

Figure 15:
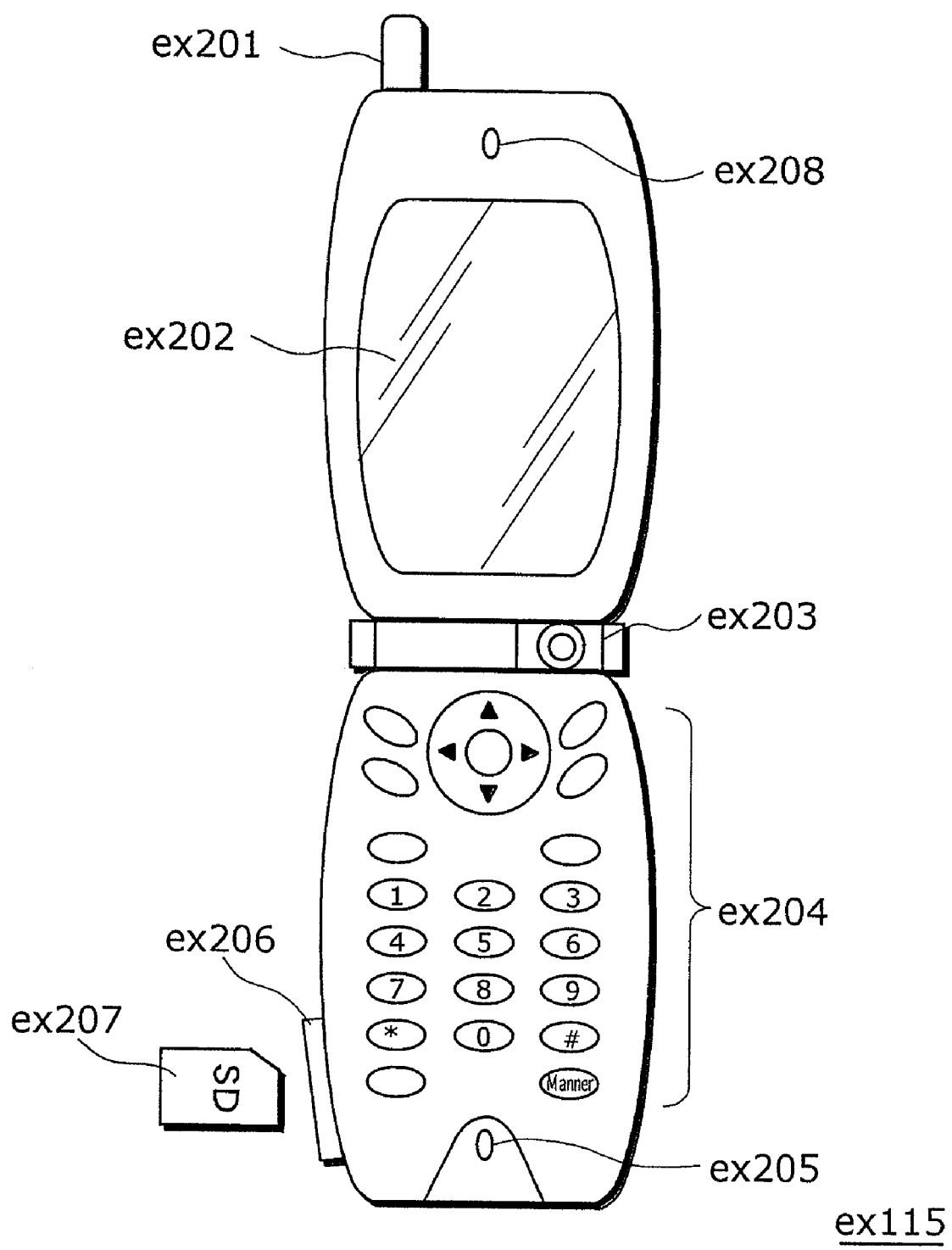
FIG. 15 is a front view of a cellular phone according to the fourth embodiment of the present invention.

FIG. 15 is a diagram showing an example of the cellular phone ex115 that employs the variable length coding and the variable length decoding explained in the above embodiments. The cellular phone ex115 has an antenna ex201 for transmitting/receiving radio waves to and from the base station ex110 via radio waves, a camera unit ex203 such as a CCD camera capable of shooting video and still pictures, a display unit ex202 such as a liquid crystal display for displaying the data obtained by decoding video and the like shot by the camera unit ex203 and video and the like received by the antenna ex201, a main body including a set of operation keys ex204, a voice output unit ex208 such as a speaker for outputting voices, a voice input unit ex205 such as a microphone for inputting voices, a recording medium ex207 for storing coded data or decoded data such as data of moving or still pictures shot by the camera, data of received e-mails and moving picture data or still picture data, and a slot unit ex206 for enabling the recording medium ex207 to be attached to the cellular phone ex115. The recording medium ex207 is embodied as a flash memory element, a kind of EEPROM (Electrically Erasable and Programmable Read Only Memory) that is an electrically erasable and rewritable non-volatile memory, stored in a plastic case such as an SD card.

Figure 16:
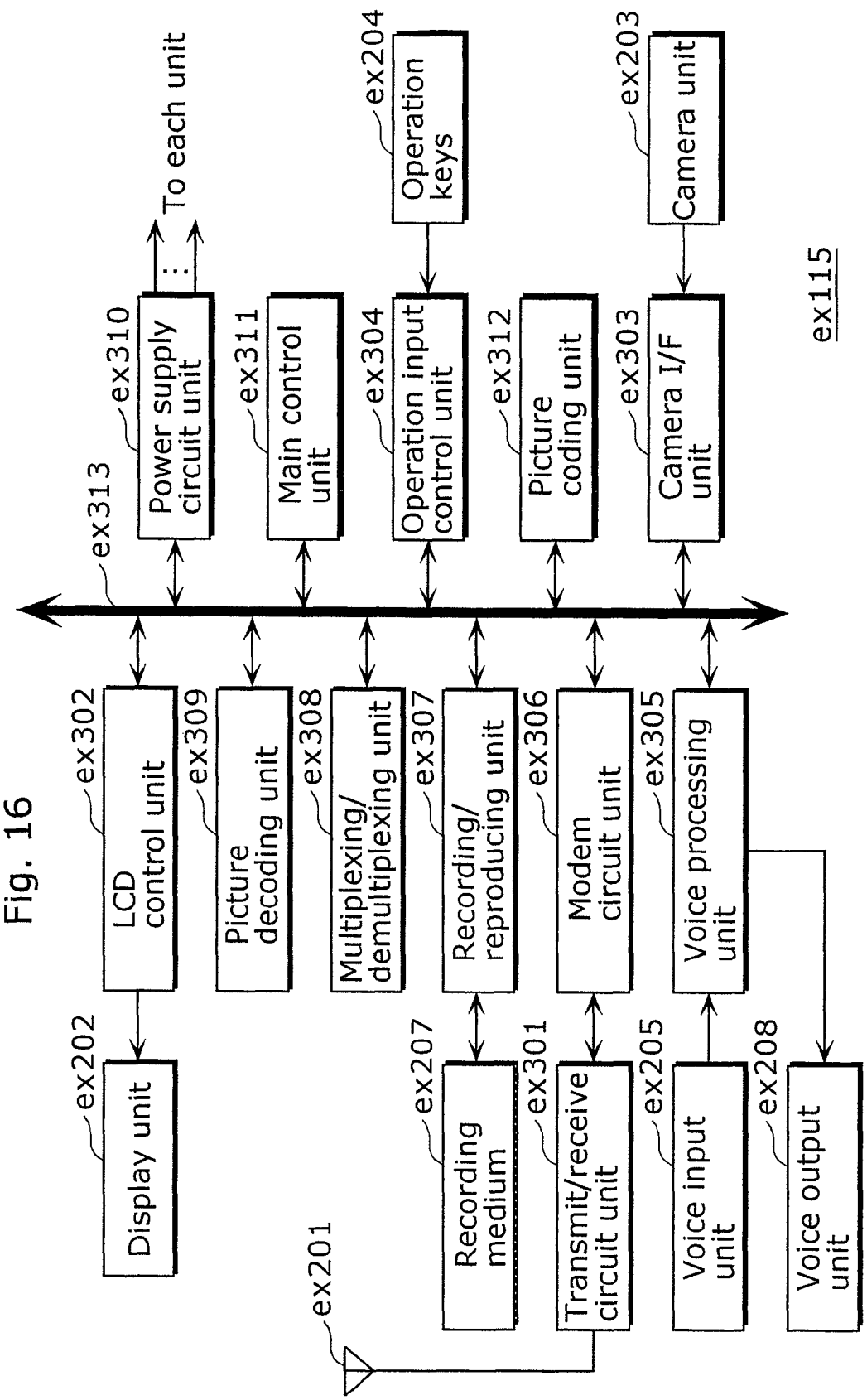
FIG. 16 is a block diagram showing the cellular phone according to the fourth embodiment of the present invention.

Next, referring to FIG. 16, an explanation is given of the cellular phone ex115. In the cellular phone ex115, a main control unit ex311 for centrally controlling the display unit ex202 and each unit of the main body having the operation keys ex204 is configured in a manner in which a power supply circuit unit ex310, an operation input control unit ex304, a picture coding unit ex312, a camera interface unit ex303, an LCD (Liquid Crystal Display) control unit ex302, a picture decoding unit ex309, a multiplexing/demultiplexing unit ex308, a recording/reproducing unit ex307, a modem circuit unit ex306, and a voice processing unit ex305 are interconnected via a synchronous bus ex313.

When a call-end key or a power key is turned ON by a user's operation, the power supply circuit unit ex310 supplies each unit with power from a battery pack, so as to activate the camera-equipped digital cellular phone ex115 to make it into a ready state.

In the cellular phone ex115, the voice processing unit ex305 converts a voice signal received by the voice input unit ex205 in conversation mode into digital voice data under the control of the main control unit ex311 comprised of a CPU, a ROM, a RAM and others, the modem circuit unit ex306 performs spread spectrum processing on it, and a transmit/receive circuit unit ex301 performs digital-to-analog conversion processing and frequency transformation processing on the data, so as to transmit the resultant via the antenna ex201. Also, in the cellular phone ex115, a received signal received by the antenna ex201 in conversation mode is amplified and performed of frequency transformation processing and analog-to-digital conversion processing, the modem circuit unit ex306 performs inverse spread spectrum processing on the resultant, and the voice processing unit ex305 converts it into an analog voice signal, so as to output it via the voice output unit ex208.

Furthermore, when sending an e-mail in data communication mode, text data of the e-mail inputted by operating the operation keys ex204 on the main body is sent out to the main control unit ex311 via the operation input control unit ex304. In the main control unit ex311, after the modem circuit unit ex306 performs spread spectrum processing on the text data and the transmit/receive circuit unit ex301 performs digital-to-analog conversion processing and frequency transformation processing on it, the resultant is transmitted to the base station ex110 via the antenna ex201.

When picture data is transmitted in data communication mode, the picture data shot by the camera unit ex203 is supplied to the picture coding unit ex312 via the camera interface unit ex303. When picture data is not to be transmitted, it is also possible to display such picture data shot by the camera unit ex203 directly on the display unit ex202 via the camera interface unit ex303 and the LCD control unit ex302.

The picture coding unit ex312, which includes the picture coding apparatus according to the present invention in its configuration, performs compression coding on the picture data supplied from the camera unit ex203 using the coding method used by the picture coding apparatus presented in the above-mentioned embodiments, so as to convert it into coded picture data, and sends it out to the multiplexing/demultiplexing unit ex308. At this time, the cellular phone ex115 sends voices received by the voice input unit ex205 while the shooting by the camera unit ex203 is taking place, to the multiplexing/demultiplexing unit ex308 as digital voice data via the voice processing unit ex305.

The multiplexing/demultiplexing unit ex308 multiplexes the coded picture data supplied from the picture coding unit ex312 and the voice data supplied from the voice processing unit ex305 using a predetermined method, the modem circuit unit ex306 performs spread spectrum processing on the resulting multiplexed data, and the transmit/receive circuit unit ex301 performs digital-to-analog conversion processing and frequency transformation processing on the resultant, so as to transmit the processed data via the antenna ex201.

When receiving, in data communication mode, data included in a moving picture file which is linked to a Web page or the like, the modem circuit unit ex306 performs inverse spread spectrum processing on the received signal received from the base station ex110 via the antenna ex201, and sends out the resulting multiplexed data to the multiplexing/demultiplexing unit ex308.

In order to decode the multiplexed data received via the antenna ex201, the multiplexing/demultiplexing unit ex308 separates the multiplexed data into a coded bit stream of picture data and a coded bit stream of voice data, and supplies such coded picture data to the picture decoding unit ex309 and such voice data to the voice processing unit ex305 via the synchronous bus ex313.

Next, the picture decoding unit ex309, which includes the picture decoding apparatus according to the present invention in its configuration, decodes the coded bit stream of the picture data using the decoding method paired with the coding method as shown in the above-mentioned embodiments so as to generate moving picture data for reproduction, and supplies such data to the display unit ex202 via the LCD control unit ex302. Accordingly, moving picture data included in the moving picture file linked to a Web page, for instance, is displayed. At the same time, the voice processing unit ex305 converts the voice data into an analog voice signal, and then supplies this signal to the voice output unit ex208. Accordingly, voice data included in the moving picture file linked to a Web page, for instance, is reproduced.

Figure 17:
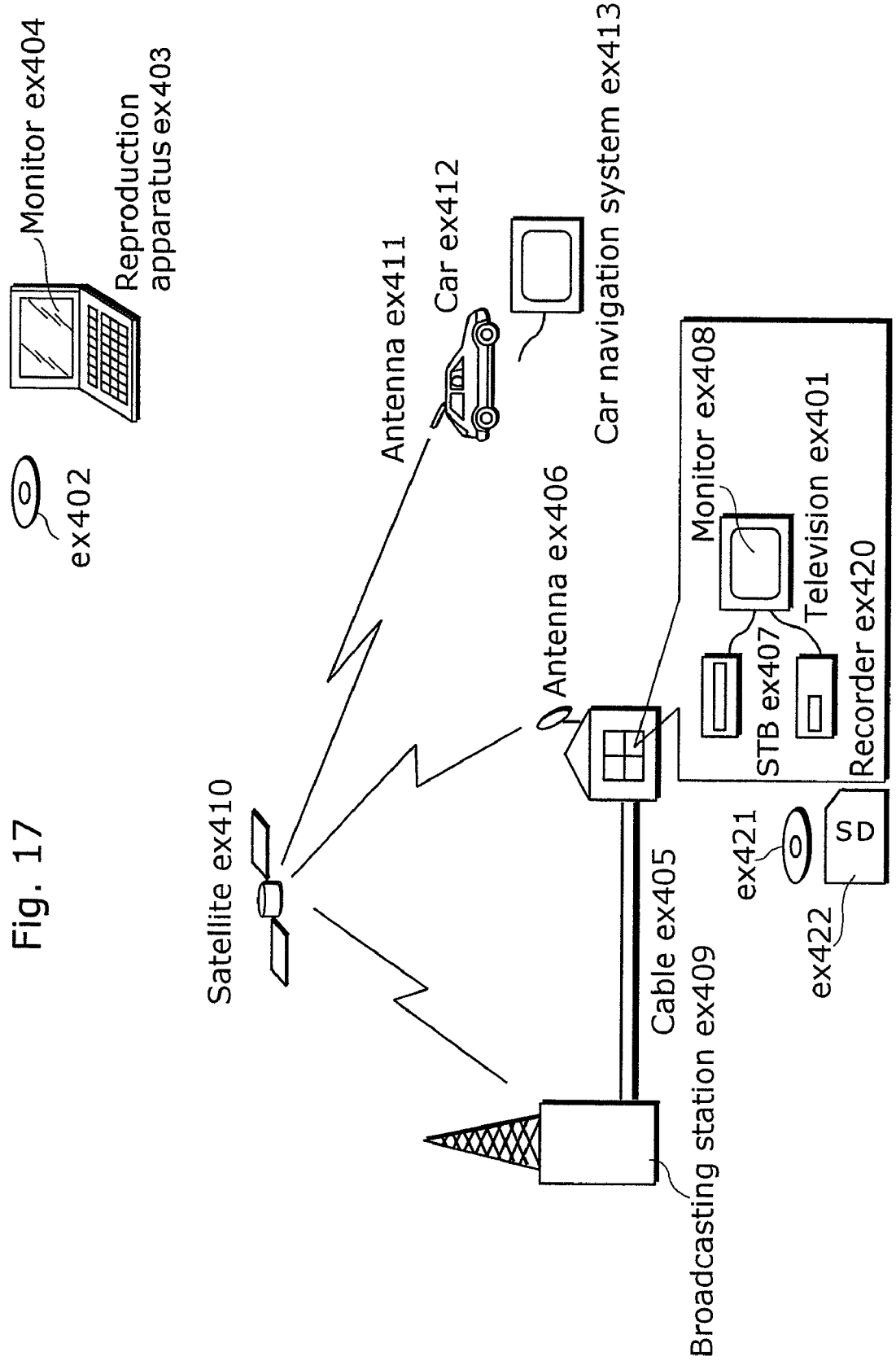
FIG. 17 is a block diagram showing an overall configuration of a digital broadcasting system according to the fourth embodiment of the present invention.

Note that the aforementioned system is not an exclusive example and therefore that at least either the picture coding apparatus or the picture decoding apparatus of the above embodiments can be incorporated into a digital broadcasting system as shown in FIG. 17, against the backdrop that satellite/terrestrial digital broadcasting has been a recent topic of conversation. To be more specific, at a broadcasting station ex409, a coded bit stream of video information is transmitted, by radio waves, to a satellite ex410 for communications or broadcasting. Upon receipt of it, the broadcast satellite ex410 transmits radio waves for broadcasting, an antenna ex406 of a house equipped with satellite broadcasting reception facilities receives such radio waves, and an apparatus such as a television (receiver) ex401 and a set top box (STP) ex407 decodes the coded bit stream and reproduces the decoded data. The picture decoding apparatus as shown in the above-mentioned embodiments can be implemented in the reproduction apparatus ex403 for reading and decoding the coded bit stream recorded on a storage medium ex402 that is a recording medium such as a CD and a DVD. In this case, a reproduced video signal is displayed on a monitor ex404. It is also conceived that the picture decoding apparatus is implemented in the set top box ex407 connected to a cable ex405 for cable television or the antenna ex406 for satellite/ground-based broadcasting so as to reproduce it on a television monitor ex408. In this case, the picture decoding apparatus may be incorporated into the television, not in the set top box. Or, a car ex412 with an antenna ex411 can receive a signal from the satellite ex410, the base station ex107 or the like, so as to reproduce a moving picture on a display device such as a car navigation system ex413 mounted on the car ex412.

Furthermore, it is also possible to code a picture signal by the moving picture coding apparatus presented in the above embodiments and to record the resultant in a recording medium. Examples include a DVD recorder for recording a picture signal on a DVD disc ex421 and a recorder ex420 such as a disc recorder for recording a picture signal on a hard disk. Moreover, a picture signal can be recorded in an SD card ex422. If the recorder ex420 is equipped with the moving picture decoding apparatus presented in the above embodiments, it is possible to reproduce a picture signal recorded on the DVD disc ex421 or in the SD card ex422, and display it on the monitor ex408.

As the configuration of the car navigation system ex413, the configuration without the camera unit ex203 and the camera interface unit ex303, out of the configuration shown in FIG. 16, is conceivable. The same is applicable to the computer ex111, the television ex401 (receiver) and the like.

Concerning the terminals such as the cellular phone ex114, a transmitting/receiving terminal having both an encoder and a decoder, as well as a transmitting terminal only with an encoder and a receiving terminal only with a decoder are possible as forms of implementation.

As stated above, it is possible to employ the variable length coding method and the variable length decoding method presented in the above embodiments into any one of the above-described devices and systems. Accordingly, it becomes possible to achieve an effect explained in the aforementioned embodiments.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

INDUSTRIAL APPLICABILITY

The variable length coding method and the variable length decoding method according to the present invention are suited to be used in a picture coding apparatus for coding a moving picture, a picture decoding apparatus for decoding a coded moving picture, and a system incorporating these apparatuses such as a content supply system for supplying a digital work and other content as well as a digital broadcasting system.

The invention claimed is:

1. A coding method for arithmetic coding, on a block basis, coefficients of frequency components which are generated by frequency transformation performed on picture data of a block which has a predetermined size of pixels, the coding method comprising:
a coefficients scanning step of scanning the coefficients of a block in a predetermined scanning order starting at a high frequency component toward a low frequency component;
a converting step of converting each absolute value of the coefficients into binary data;
an arithmetic coding step of performing arithmetic coding on a first bit of the binary data corresponding to each absolute value of the coefficients according to the predetermined scanning order by using a plurality of probability tables; and
a switching step of switching between the plurality of probability tables, from a current probability table for the first bit of the binary data corresponding to a first coefficient to be coded, to a new probability table for the first bit of the binary data corresponding to a second coefficient to be coded, based on a result of a comparison between an absolute value of the first coefficient to be coded and a predetermined threshold value,
wherein, in the switching step, the switching between the plurality of probability tables is performed in a predetermined one direction within each block such that each of the probability tables, which has been used for performing arithmetic coding on the first bit of the binary data corresponding to an already coded coefficient before switching to the new probability table, is not used within each block after switching to the new probability table, and the switching is not performed in the direction opposite to the predetermined one direction regardless of said result of the comparison, and
wherein, within each block, if a predetermined one of the plurality of probability tables has been used to perform arithmetic coding, the switching between the plurality of probability tables is not performed regardless of said result of the comparison.

2. The coding method according to claim 1,
wherein, in the switching step, the switching to the new probability table is performed after a number of coded coefficients having an absolute value exceeding 1 becomes a non-zero value, and the switching between the plurality of probability tables is not performed after the switching to the new probability table.

3. The coding method according to claim 1,
wherein, in the arithmetic coding step, the arithmetic coding is performed separately on the first bit and another bit of the binary data, and a probability table used in the arithmetic coding of said first bit of the binary data and a probability table used in the arithmetic coding of said another bit of the binary data are different when the arithmetic coding is performed on the binary data.

4. A computer readable recording medium having stored thereon a computer program including instructions for causing a computer to execute a coding method for arithmetic coding, on a block basis, coefficients of frequency components which are generated by frequency transformation performed on picture data of a block which has a predetermined size of pixels,
wherein the coding method comprises:
a coefficients scanning step of scanning the coefficients of a block in a predetermined scanning order starting at a high frequency component toward a low frequency component;
a converting step of converting each absolute value of the coefficients into binary data;
an arithmetic coding step of performing arithmetic coding on a first bit of the binary data corresponding to each absolute value of the coefficients according to the predetermined scanning order by using a plurality of probability tables; and
a switching step of switching between the plurality of probability tables, from a current probability table for the first bit of the binary data corresponding to a first coefficient to be coded, to a new probability table for the first bit of the binary data corresponding to a second coefficient to be coded, based on a result of a comparison between an absolute value of the first coefficient to be coded and a predetermined threshold value,
wherein, in the switching step, the switching between the plurality of probability tables is performed in a predetermined one direction within each block such that each of the probability tables, which has been used for performing arithmetic coding on the first bit of the binary data corresponding to an already coded coefficient before switching to the new probability table, is not used within each block after switching to the new probability table, and the switching is not performed in the direction opposite to the predetermined one direction regardless of said result of the comparison, and
wherein, within each block, if a predetermined one of the plurality of probability tables has been used to perform arithmetic coding, the switching between the plurality of probability tables is not performed regardless of said result of the comparison.

5. The coding method according to claim 1,
wherein, in the switching step, the switching between the plurality of probability tables is performed in the predetermined one direction such that when a last one of the plurality of probability tables which can be used to perform arithmetic coding is used, said last one of the probability tables is used to perform arithmetic coding on the first bit of the binary data corresponding to each absolute value of all subsequent ones of the coefficients, and wherein said last one of the plurality of probability tables is said predetermined one of the probability tables.

6. The computer readable recording medium according to claim 4,
wherein, in the switching step, the switching between the plurality of probability tables is performed in the predetermined one direction such that when a last one of the plurality of probability tables which can be used to perform arithmetic coding is used, said last one of the probability tables is used to perform arithmetic coding on the first bit of the binary data corresponding to each absolute value of all subsequent ones of the coefficients, and wherein said last one of the plurality of probability tables is said predetermined one of the probability tables.

* * * * *